(12) United States Patent
Bae et al.

(10) Patent No.: US 12,374,664 B2
(45) Date of Patent: Jul. 29, 2025

(54) DISPLAY DEVICE AND METHOD OF FABRICATING THE SAME

(71) Applicant: Samsung Display Co., LTD., Yongin-si (KR)

(72) Inventors: Joon Hwa Bae, Yongin-si (KR); Bong Gu Kang, Yongin-si (KR); Woo Jin Cho, Yongin-si (KR); Seung Bae Kang, Yongin-si (KR); Hee Sung Yang, Yongin-si (KR); Byoung Kwon Choo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 533 days.

(21) Appl. No.: 17/552,198

(22) Filed: Dec. 15, 2021

(65) Prior Publication Data

US 2022/0199694 A1    Jun. 23, 2022

(30) Foreign Application Priority Data

Dec. 17, 2020 (KR) .......................... 10-2020-0177877

(51) Int. Cl.
*H10K 59/38* (2023.01)
*B29C 59/02* (2006.01)
(Continued)

(52) U.S. Cl.
CPC .......... *H01L 25/0753* (2013.01); *B29C 59/02* (2013.01); *H01L 25/167* (2013.01);
(Continued)

(58) Field of Classification Search
CPC ............. H01L 27/1214; H01L 25/0753; H01L 27/156; H01L 33/504; H01L 33/507;
(Continued)

(56) References Cited

U.S. PATENT DOCUMENTS 8,617,275 B2    12/2013 Hoshi et al.
11,355,558 B2    6/2022 Park et al.
(Continued)

FOREIGN PATENT DOCUMENTS

JP        4956916 B2     6/2012
JP     2017-161604 A     9/2017
(Continued)

*Primary Examiner* — Moazzam Hossain
(74) *Attorney, Agent, or Firm* — Womble Bond Dickinson (US) LLP

(57) ABSTRACT

A method of fabricating a display device includes: preparing a substrate including emission areas and a non-emission area between the emission areas; forming a bank on the non-emission area to a first height; forming light conversion patterns on the emission areas to a height equal to or less than the first height; polishing a surface of a light conversion layer including the bank and the light conversion patterns so that the surface of the light conversion layer is flat; and forming a filler layer on a surface of the substrate on which the light conversion layer is provided. The polishing of the light conversion layer includes planarizing the surface of the light conversion layer so that the bank and the light conversion patterns have a second height through chemical mechanical polishing utilizing a metallic slurry.

11 Claims, 15 Drawing Sheets

(51) Int. Cl.
*H01L 25/075* (2006.01)
*H01L 25/16* (2023.01)
*H10K 50/854* (2023.01)
*H10K 59/122* (2023.01)
*H10K 59/80* (2023.01)
*B29L 31/34* (2006.01)
*H10K 102/00* (2023.01)

(52) U.S. Cl.
CPC ........... *H10K 50/854* (2023.02); *H10K 59/38* (2023.02); *H10K 59/873* (2023.02); *H10K 59/876* (2023.02); *H10K 59/877* (2023.02); *H10K 59/8792* (2023.02); *B29C 2059/027* (2013.01); *B29L 2031/3475* (2013.01); *H10K 59/122* (2023.02); *H10K 2102/331* (2023.02)

(58) Field of Classification Search
CPC ............. H01L 2933/0041; H01L 33/50; H01L 27/146–14893; C09G 1/02; C09K 3/1409; G02B 5/201; B29C 59/02; H10K 59/38; H10K 59/122; H10K 59/1213; H10K 59/35; H10K 59/873; H10K 59/876; H10K 59/877; H10K 59/8792
See application file for complete search history.

(56) References Cited

U.S. PATENT DOCUMENTS

| | | | |
|---|---|---|---|
| 2018/0231880 A1 | 8/2018 | Masuda | |
| 2020/0043976 A1 | 2/2020 | Kim et al. | |
| 2020/0343315 A1* | 10/2020 | Lin | H10K 59/126 |
| 2021/0223672 A1* | 7/2021 | Yokoo | F21V 7/30 |
| 2022/0157891 A1* | 5/2022 | Zhao | H01L 25/0753 |
| 2023/0216015 A1* | 7/2023 | Akimoto | H10H 29/142 257/79 |

FOREIGN PATENT DOCUMENTS

| | | |
|---|---|---|
| KR | 10-0358503 B1 | 10/2002 |
| KR | 10-1186003 B1 | 9/2012 |
| KR | 10-2020-0016424 A | 2/2020 |
| KR | 10-2020-0117080 A | 10/2020 |

* cited by examiner

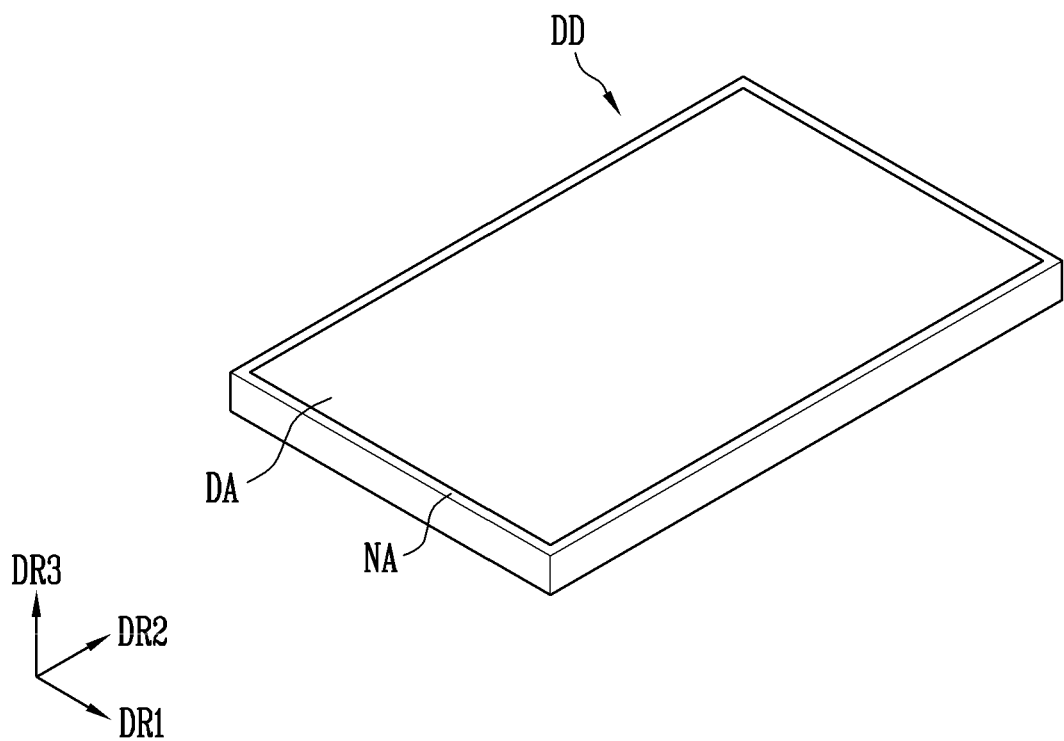
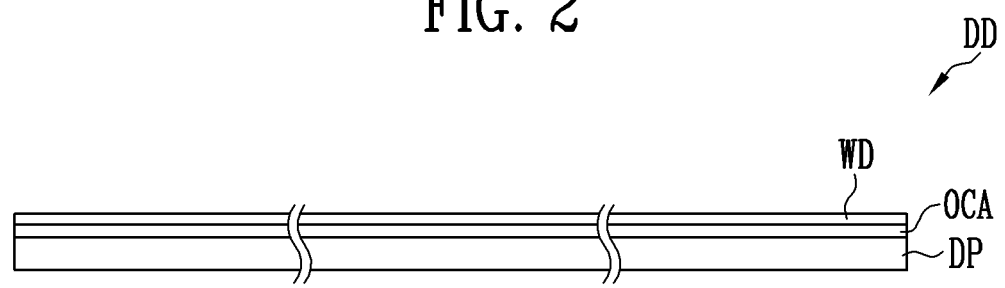

PXL: PXL1, PXL2, PXL3

DISPLAY DEVICE AND METHOD OF FABRICATING THE SAME

CROSS-REFERENCE TO RELATED APPLICATION

This application claims priority to and the benefit of Korean Patent Application No. 10-2020-0177877, filed in the Korean Intellectual Property Office on Dec. 17, 2020, the entire content of which is hereby incorporated by reference.

BACKGROUND

1. Field

Embodiments of the present disclosure relate to a display device and a method of fabricating the same.

2. Description of the Related Art

Recently, interest in information display has been increasing. Accordingly, research and development on display devices are continuously being conducted.

SUMMARY

An aspect of embodiments of the present disclosure is directed towards a display device including a light conversion layer and a method of fabricating the same.

The aspects of embodiments of the present disclosure are not limited to the above aspect, and other aspects that are not mentioned herein will be clearly understood by those of ordinary skill in the art from the following description.

A method of fabricating a display device according to an embodiment of the present disclosure includes: preparing a substrate including emission areas and a non-emission area between the emission areas; forming a bank on the non-emission area to a first height; forming light conversion patterns on the emission areas to a height equal to or less than the first height; polishing a surface of a light conversion layer including the bank and the light conversion patterns so that the surface of the light conversion layer is flat (e.g., substantially flat); and forming a filler layer on a (e.g., one) surface of the substrate on which the light conversion layer is provided. The polishing of the light conversion layer includes planarizing the surface of the light conversion layer so that the bank and the light conversion patterns have a second height through chemical mechanical polishing utilizing (e.g., using) a metallic slurry.

In an embodiment, the polishing of the light conversion layer may include removing a height difference between the bank and the light conversion patterns utilizing (e.g., using) an alumina slurry or a zirconia slurry having a Mohs hardness of 8 or more.

In an embodiment, the alumina slurry or the zirconia slurry may have a particle size of about 300 μm to about 1,000 μm.

In an embodiment, the filler layer may be formed to a thickness of about 1.5 μm to about 3 μm.

In an embodiment, the light conversion patterns may be formed through inkjet printing.

In an embodiment, each of the light conversion patterns may include at least one selected from color conversion particles and light scattering particles.

In an embodiment, the emission areas may include a first emission area of a first color pixel, a second emission area of a second color pixel, and a third emission area of a third color pixel, and the forming of the light conversion patterns may include supplying an ink comprising color conversion particles of a first color to the first emission area and an ink comprising color conversion particles of a second color to the second emission area, and supplying an ink including the light scattering particles to the third emission area.

In an embodiment, the method may further include, prior to forming the bank, forming a color filter layer on a (e.g., one) surface of the substrate, wherein the light conversion layer may be formed on a (e.g., one) surface of the substrate on which the color filter layer is provided.

In an embodiment, the method may further include: forming pixels on a base layer; and coupling (e.g., attaching) the base layer and the substrate so that a (e.g., one) surface of the base layer on which the pixels are formed is in contact with the filler layer.

A display device according to an embodiment of the present disclosure includes: a base layer including a display area; a plurality of pixels arranged in the display area and including respective emission areas; a light conversion layer including light conversion patterns on the emission areas of the pixels, and a bank between the light conversion patterns to surround or be around (e.g., partially or entirely surround) side surfaces of the light conversion patterns; and a filler layer between the light conversion layer and a (e.g., one) surface of the base layer on which the pixels are on, wherein the light conversion layer has a flat (e.g., substantially flat) surface facing the pixels, and at least one of the light conversion patterns includes microcavities formed on (e.g., in) a surface thereof.

In an embodiment, surfaces of the light conversion patterns facing the pixels may be the same as a surface of the bank facing the pixels in height with respect to the base layer.

In an embodiment, the light conversion patterns may be the same as the bank in thickness.

In an embodiment, each of the light conversion patterns may include at least one selected from color conversion particles and light scattering particles.

In an embodiment, the microcavities may be less than or equal to the color conversion particles or the light scattering particles in size.

In an embodiment, the pixels may include a first color pixel, a second color pixel, and a third color pixel, and the light conversion patterns may include: a first light conversion pattern on an emission area of the first color pixel and including first color conversion particles; a second light conversion pattern on an emission area of the second color pixel and including second color conversion particles; and a third light conversion pattern on an emission area of the third color pixel and including light scattering particles.

In an embodiment, the filler layer may have a thickness of about 1.5 μm to about 3 μm.

In an embodiment, the bank may have a tapered shape or an inverted tapered shape.

In an embodiment, the display device may further include: a color filter layer on the light conversion layer; and an encapsulation substrate on the color filter layer.

In an embodiment, the display device may further include a color filter layer on the light conversion layer.

In an embodiment, the display device may further include an encapsulation substrate on the color filter layer.

Specific matters, features, and/or aspects of other embodiments are included in the detailed description and drawings.

In the display device and the method of fabricating the same according to the embodiments of the present disclosure, the surface of the light conversion layer may be planarized within a range that prevents, minimizes, or reduces damage to the light conversion layer including the light conversion patterns and the bank, and foreign matter may be stably removed. Therefore, the thickness of the filler layer may be reduced, and the light emission efficiency of the light generated from the pixels may be increased.

In addition, the height or thickness of the bank may be reduced during the process of polishing the light conversion layer for planarization. Therefore, it is possible to prevent or protect the bank from being peeled off or to reduce peeling of the bank.

Aspects according to the embodiments are not limited by the above contents presented above, and more various and suitable aspects are incorporated in the present specification.

BRIEF DESCRIPTION OF THE DRAWINGS

FIG. 1 is a perspective view illustrating a display device according to an embodiment of the present disclosure.

FIG. 2 is a cross-sectional view illustrating a display device according to an embodiment of the present disclosure.

DETAILED DESCRIPTION

Figure 3:
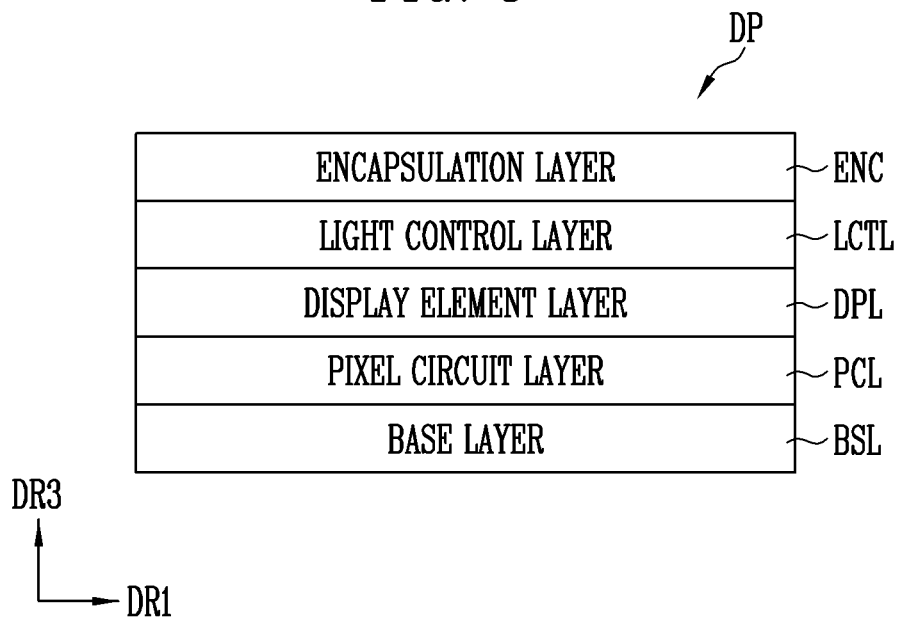
FIG. 3 is a cross-sectional view schematically illustrating a configuration of a display panel according to an embodiment of the present disclosure.

As the present description allows for various suitable changes and numerous embodiments, certain embodiments will be illustrated in the drawings and described in more detail in the written description. The singular forms "a," "an," and "the" as used herein are intended to include the plural forms as well unless the context clearly indicates otherwise. As used herein, the use of the term "may," when describing embodiments of the present disclosure, refers to "one or more embodiments of the present disclosure." As used herein, the term "and/or" includes any and all combinations of one or more of the associated listed items.

As used herein, the terms "substantially," "about," "approximately," and similar terms are used as terms of approximation and not as terms of degree, and are intended to account for the inherent deviations in measured or calculated values that would be recognized by those of ordinary skill in the art. "About" and "approximately," as used herein, is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, or 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The present disclosure is not limited to the following embodiments and may be embodied in various suitable forms. In addition, each of the embodiments disclosed below may be implemented alone, or may be implemented in combination with at least one other embodiment.

In the drawings, some elements that are not directly related to the features of the present disclosure may be omitted to clearly illustrate the present disclosure. In addition, some elements in the drawings may be exaggerated in size and/or ratio for clarity of illustration and/or description. The same reference numerals and symbols are assigned to the same or similar elements throughout the drawings even when they are illustrated on different drawings, and redundant descriptions thereof may not be provided.

FIG. 1 is a perspective view illustrating a display device DD according to an embodiment of the present disclosure. FIG. 2 is a cross-sectional view illustrating a display device DD according to an embodiment of the present disclosure. FIG. 3 is a cross-sectional view schematically illustrating a configuration of a display panel DP according to an embodiment of the present disclosure.

Referring to FIG. 1, the display device DD may include a display area DA and a non-display area NA (also referred to as a "bezel area"). The display area DA may be an area that includes pixels to display an image. The non-display area NA may be an area other than the display area DA, and, in some embodiments, an image may not be displayed in the non-display area NA.

The display area DA may have various suitable shapes, and may include pixels. For example, the display area DA may have various suitable shapes including a rectangular shape, a circular shape, or an elliptical shape, and pixels may be disposed in the display area DA.

The display area DA may be formed on at least one surface of the display device DD. As an example, the display area DA may be formed on a front surface of the display device DD, and, in some embodiments, may be additionally formed on a side surface and/or a rear surface of the display device DD.

The non-display area NA may be disposed around the display area DA so as to surround or be around (e.g., partially or entirely surround) at least one region of the display area DA. The non-display area NA may include lines, pads, and/or a driving circuit coupled (e.g., connected) to the pixels of the display area DA.

The display device DD may be provided in various suitable shapes. As an example, the display device DD may be provided in a rectangular plate shape, but the present disclosure is not limited thereto. For example, the display device DD may have a shape such as a circular shape or an elliptical shape. In addition, although FIG. 1 illustrates that the display device DD has an angled corner (e.g., a corner forming an angle, for example, a right angle), the present disclosure is not limited thereto. For example, the display device DD may have a curved corner.

For convenience, FIG. 1 illustrates that the display device DD has a rectangular plate shape including a pair of short sides and a pair of long sides. An extending direction of the short side is indicated by a first direction DR1, an extending direction of the long side is indicated by a second direction DR2, and a direction normal (e.g., perpendicular) to the extending direction of the long side and the short side (e.g., a thickness or height direction of the display device DD) is indicated by a third direction DR3. However, this may be changed according to the shape of the display device DD.

The display device DD may have flexibility so that deformation (e.g., foldability) may occur (e.g., be provided) in at least one area, or may not have flexibility so that substantial deformation does not occur in the entire area. For example, the display device DD may be a flexible display device or a rigid display device. When the display device DD has flexibility in at least one area, the display device DD may be foldable, bendable, and/or rollable in the flexible area.

Referring to FIG. 2, the display device DD may include a display panel DP and a window WD provided above the display panel DP. In an embodiment, the window WD may be integrally fabricated with the display panel DP. For example, the window WD may be directly formed on a surface of the display panel DP. In another embodiment, after the window WD is fabricated separately from the display panel DP, the window WD may be coupled to the display panel DP through an optically clear adhesive (OCA).

The display panel DP includes pixels for displaying an image, and may be a display panel of various suitable types (e.g., kinds) and/or structures. In an embodiment, the display panel DP may be a self-luminous display panel utilizing (e.g., using) an organic light emitting diode and/or an ultra-small inorganic light emitting diode having a size of nano-scale or micro-scale), but the present disclosure is not limited thereto.

The window WD may be disposed on the display panel DP to protect the display panel DP from external impact, and may provide an input surface and/or a display surface to a user. The window WD may include (e.g., be) various suitable materials including (e.g., being) glass and/or plastics, and may have flexibility in at least one area, or may not have flexibility in the entire area.

Meanwhile, the display device DD may further include at least one sensor, such as a touch sensor. For example, the display device DD may include a touch sensor, a fingerprint sensor, a pressure sensor, and/or a temperature sensor.

Each sensor may be integrally formed with the display panel DP, or may be fabricated separately from the display panel DP and disposed around and/or on the display panel DP (e.g., the front, rear and/or side surfaces of the display panel DP). As an example, the touch sensor may be provided on the front surface of the display panel DP (the upper surface on which an image is to be displayed) so as to be disposed between the display panel DP and the window WD, and may be provided integrally with the display panel DP.

Referring to FIG. 3, the display panel DP may include a base layer BSL, and a pixel circuit layer PCL, a display element layer DPL, a light control layer LCTL, and an encapsulation layer ENC, which are sequentially disposed on a surface of the base layer BSL.

In a case (e.g., an embodiment) that the display panel DP is a passive display panel, the pixel circuit layer PCL may be omitted. In this case, only lines for driving the pixels may be disposed under the display element layer DPL, or the lines may be directly coupled (e.g., directly connected) to and/or formed on the display element layer DPL.

The base layer BSL may be a rigid or flexible substrate (or film). In an embodiment, when the base layer BSL is a rigid substrate, the base layer BSL may include (e.g., be) at least one selected from a glass substrate, a quartz substrate, a glass ceramic substrate, and a crystalline glass substrate. In another embodiment, when the base layer BSL is a flexible substrate, the base layer BSL may include (e.g., be) at least one selected from a film substrate and a plastic substrate including (e.g., being) a polymer organic material. In addition, the base layer BSL may include (e.g., be) fiber glass reinforced plastic (FRP).

The pixel circuit layer PCL may be disposed on a surface of the base layer BSL. The pixel circuit layer PCL may include circuit elements for configuring the pixel circuit of each pixel, and various suitable lines coupled (e.g., connected) to the circuit elements. For example, the pixel circuit layer PCL may include transistors and/or a storage capacitor constituting the pixel circuit of each pixel, and gate lines, data lines, and power lines coupled (e.g., connected) to each pixel circuit. According to an embodiment, the gate lines may include at least scan lines, and may optionally further include other types (e.g., kinds) of control lines. In addition, the pixel circuit layer PCL may further include at least one insulating layer, including a protective layer covering the circuit elements and/or the lines.

The display element layer DPL may be disposed on the pixel circuit layer PCL. In an embodiment, the display element layer DPL includes a light emitting element constituting a light source of each pixel, and the light emitting element may include (e.g., be) an organic and/or inorganic light emitting diode.

The light control layer LCTL may be provided on the image display surface of the display panel DP. For example, when it is assumed that the display panel DP emits light in the upper (upward) direction of the display element layer DPL (e.g., the third direction DR3) to display an image on the front of the display panel DP, the light control layer LCTL may be disposed on the display element layer DPL. As an example, the light control layer LCTL may be provided between the display element layer DPL and the encapsulation layer ENC.

The light control layer LCTL may include light control elements for converting and/or adjusting characteristics of light emitted from the display element layer DPL. For example, the light control layer LCTL may include a color filter layer including color filters of certain colors, and/or a light conversion layer including color conversion particles of certain colors (e.g., red and green quantum dots) and light scattering particles. When the light control layer LCTL includes color conversion particles, the color of light generated from at least some pixels may be converted. For example, the light control layer LCTL may selectively transmit light of a set or specific wavelength band among the lights generated from the display element layer DPL, and/or may convert the wavelength band of light emitted from the display element layer DPL. The encapsulation layer ENC may be disposed on the light control layer LCTL. The encapsulation layer ENC may be an encapsulation substrate (or referred to as an upper substrate), or a single or multi-layer thin film encapsulation layer. The encapsulation layer ENC may protect the pixels by preventing or blocking external air and/or moisture from penetrating into the display panel DP including the display element layer DPL.

In cases where the encapsulation layer ENC is an encapsulation substrate, the encapsulation substrate may be coupled (e.g., connected) to the base layer BSL by a sealing material and/or the like. For example, the encapsulation substrate may be coupled (e.g., attached) to a surface of the base layer BSL provided with pixels PXL by a sealing material. For example, the pixels PXL may be on the surface of the base layer BSL and/or may be between the base layer BSL and the encapsulation substrate.

In cases where the encapsulation layer ENC is a multilayer thin film encapsulation layer, the encapsulation layer ENC may include an inorganic film and/or an organic film. For example, the encapsulation layer ENC may have a multilayer structure in which an inorganic film, an organic film, and another inorganic film are sequentially stacked.

Figure 4:
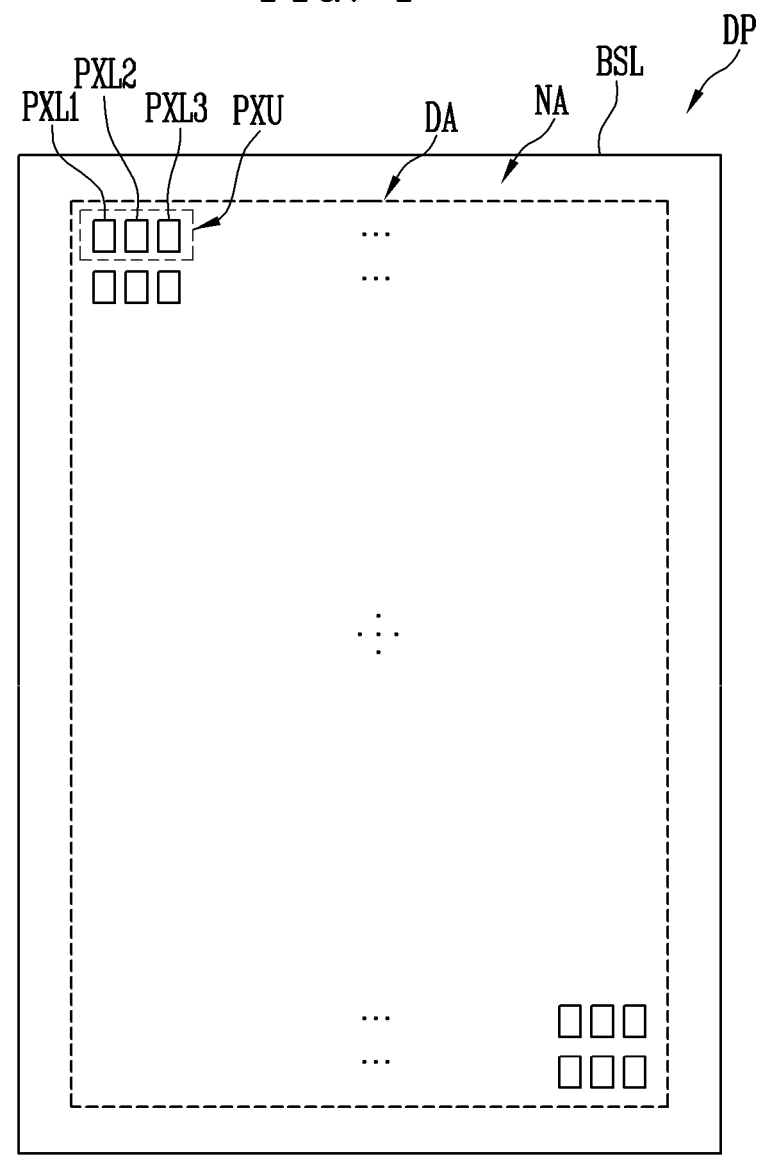
FIG. 4 is a plan view illustrating a display panel according to an embodiment of the present disclosure.

FIG. 4 is a plan view illustrating a display panel DP according to an embodiment of the present disclosure. For convenience, in FIG. 4, the structure of the display panel DP is briefly illustrated focusing on the display area DA. However, according to some embodiments, at least one driving circuit unit, lines, and/or pads may be further provided on the display panel DP.

Referring to FIG. 4, the display panel DP may include a base layer BSL and pixels PXL provided on the base layer BSL. According to an embodiment, the pixels PXL may include first color pixels PXL1, second color pixels PXL2, and/or third color pixels PXL3. For example, each of the pixels PXL may be a first color pixel PXL1, a second color pixel PXL2, or a third color pixel PXL3.

The display panel DP and the base layer BSL for forming the same may include a display area DA for displaying an image and a non-display area NA excluding the display area DA (e.g., around or surrounding (e.g., partially or entirely surrounding) the display area DA).

The display area DA may be disposed at the central portion of the display panel DP, and the non-display area NA may be disposed at the edge portion of the display panel DP so as to surround or be around (e.g., partially or entirely surround) the display area DA. However, the positions of the display area DA and the non-display area NA may be changed. The display area DA may constitute a screen on which an image is to be displayed, and the non-display area NA may be an area other than the display area DA.

A plurality of pixels PXL may be disposed in the display area DA on the base layer BSL. As an example, the display area DA may include a plurality of pixel areas in which each pixel PXL is disposed. The non-display area NA may be disposed around the display area DA, and various suitable lines, pads, and/or built-in circuit units coupled (e.g., connected) to the pixels PXL of the display area DA may be disposed in the non-display area NA.

The pixels PXL may be regularly disposed in the display area DA according to a stripe or PENTILE® (Trademark of Samsung Display Co., Ltd.) arrangement structure. For example, the pixels PXL may be arranged in a RGBG matrix structure. In addition, the pixels PXL may be disposed in the display area DA in various suitable structures and/or methods.

According to an embodiment, at least two types (e.g., kinds) of pixels PXL for emitting light of different colors may be provided in the display area DA. For example, the first color pixels PXL1, the second color pixels PXL2, and the third color pixels PXL3 may be regularly disposed in the display area DA. At least one first color pixel PXL1, at least one second color pixel PXL2, and at least one third color pixel PXL3 may constitute one pixel unit PXU. For example, the at least one first color pixel PXL1, the at least one one second color pixel PXL2, and the at least one third color pixel PXL3 may be adjacent to each other.

Meanwhile, in describing the embodiment of the present disclosure, it is assumed that three pixels PXL adjacent to each other constitute one pixel unit PXU, but the present disclosure is not limited thereto. For example, the number, type (e.g., kind), and/or mutual arrangement structure of the pixels PXL constituting each pixel unit PXU may be variously and suitably changed according to embodiments.

According to an embodiment, the first color pixel PXL1 may be a red pixel for emitting red light, the second color pixel PXL2 may be a green pixel for emitting green light, and the third color pixel PXL3 may be a blue pixel for emitting blue light. In an embodiment, because the first color pixel PXL1, the second color pixel PXL2, and the third color pixel PXL3 each respectively include a first color light emitting element, a second color light emitting element, and a third color light emitting element as a light source, the light of the first color, the second color, and the third color may be emitted. In another embodiment, the first color pixel PXL1, the second color pixel PXL2, and the third color pixel PXL3 include light emitting elements that emit light of the same color. Because light conversion patterns of different colors disposed on each emission area are included, the light of the first color, the second color, and the third color may be emitted.

In addition, the color, type (e.g., kind), and/or number of pixels PXL constituting each pixel unit PXU are not particularly limited. For example, the color of light emitted from each pixel PXL may be variously and suitably changed.

In an embodiment, the pixel PXL may include at least one light source driven by a certain control signal(s) (e.g., a scan signal and/or a data signal) and/or certain power supply voltages (e.g., a first power supply voltage and/or a second power supply voltage). As the light source, various suitable types (e.g., kinds), shapes, and/or sizes of light emitting elements may be utilized (e.g., used).

In addition, the pixel PXL may have a structure according to at least one of the embodiments to be described below. For example, each pixel PXL may have a structure to which any one of the embodiments to be described later is applied, or a structure to which at least two embodiments are applied in suitable combination.

In an embodiment, the pixel PXL may be configured as an active pixel, but the present disclosure is not limited thereto. For example, in another embodiment, the pixel PXL may be configured as a passive pixel.

Figure 5:
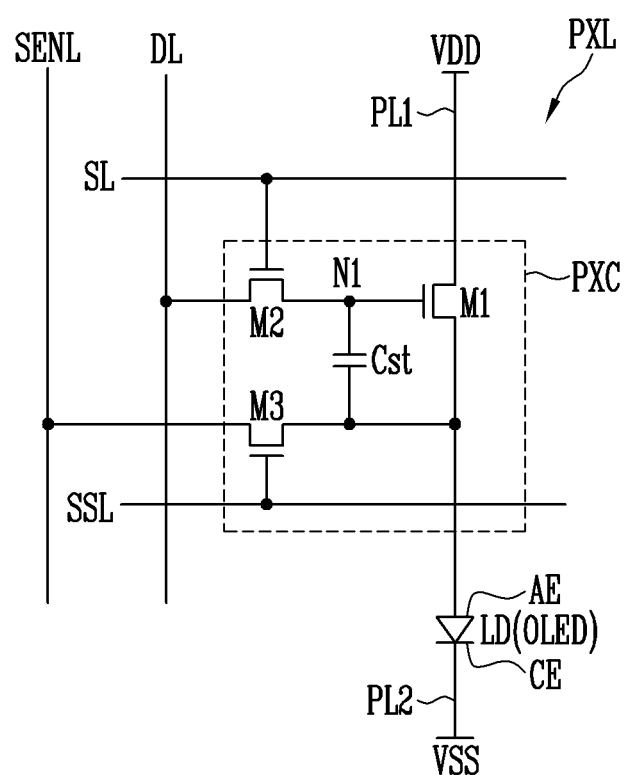
FIGS. 5 and 6 are circuit diagrams illustrating a pixel according to an embodiment of the present disclosure, respectively.
Figure 6:
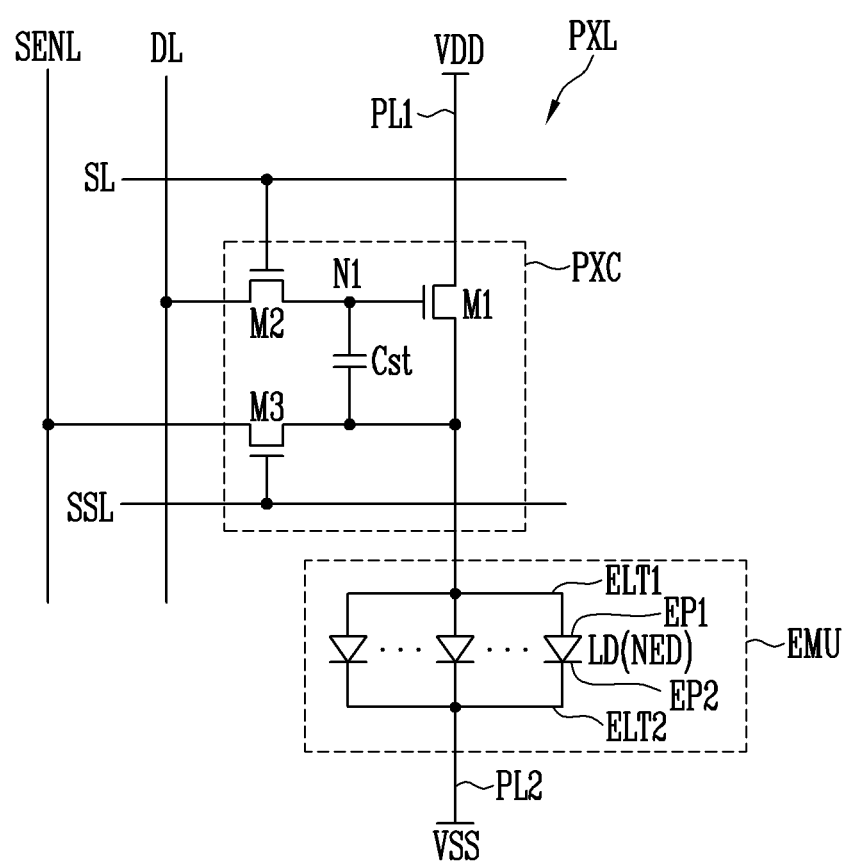

FIGS. 5 and 6 are circuit diagrams illustrating a pixel PXL according to an embodiment of the present disclosure, respectively. For example, FIGS. 5 and 6 illustrate different embodiments of the pixel PXL including at least one light emitting element LD, respectively. As an example, FIG. 5 illustrates an embodiment of a pixel PXL including an organic light emitting diode OLED as a light emitting element LD, and FIG. 6 illustrates an embodiment of a pixel PXL including a plurality of inorganic light emitting diodes NED as a light emitting element LD.

First, referring to FIG. 5, the pixel PXL may include an organic light emitting diode OLED coupled (e.g., connected) between a first power supply voltage VDD and a second power supply voltage VSS, and may optionally further include a pixel circuit PXC for driving the organic light emitting diode OLED.

The pixel circuit PXC may be coupled (e.g., connected) between the first power supply voltage VDD and the organic light emitting diode OLED. In addition, the pixel circuit PXC may be coupled (e.g., connected) to the scan line SL and the data line DL of the pixel PXL to control the operation of the organic light emitting diode OLED in response to a scan signal and a data signal respectively supplied from the scan line SL and the data line DL. In addition, the pixel circuit PXC may be optionally further coupled (e.g., connected) to a sensing signal line SSL and a sensing line SENL.

In describing the embodiments of the present disclosure, the term "connection (or coupling)" and similar terms may comprehensively refer to a physical and/or electrical connection (or coupling). In addition, the term "connection (or coupling)" and similar terms may comprehensively refer to a direct or indirect connection (or coupling), and an integrated or non-integrated connection (or coupling).

The pixel circuit PXC may include at least one transistor and a capacitor. For example, the pixel circuit PXC may include a first transistor M1, a second transistor M2, a third transistor M3, and a storage capacitor Cst.

The first transistor M1 is coupled (e.g., connected) between the first power supply voltage VDD and a first electrode AE (e.g., an anode electrode) of the organic light emitting diode OLED. A gate electrode of the first transistor M1 is coupled (e.g., connected) to a first node N1.

The first transistor M1 controls a driving current supplied to the organic light emitting diode OLED in response to the voltage of the first node N1. For example, the first transistor M1 may be a driving transistor that controls the driving current of the pixel PXL.

In an embodiment, the first transistor M1 may optionally include a bottom metal layer (or a back gate electrode). The gate electrode of the first transistor M1 and the bottom metal layer may overlap each other with a semiconductor pattern including a channel region therebetween.

The second transistor M2 is coupled (e.g., connected) between the data line DL and the first node N1. A gate electrode of the second transistor M2 is coupled (e.g., connected) to the scan line SL.

The second transistor M2 is turned on when a scan signal of a gate-on voltage (e.g., a high level voltage) is supplied from the scan line SL, and couples (e.g., connects) the data line DL to the first node N1. A data signal of a corresponding frame is supplied to the data line DL during each frame period, and the data signal is transmitted to the first node N1 through the second transistor M2, which is turned on during a period in which the scan signal of the gate-on voltage is supplied. For example, the second transistor M2 may be a switching transistor for transmitting each data signal to the pixel PXL.

One electrode of the storage capacitor Cst is coupled (e.g., connected) to the first node N1, and the other electrode of the storage capacitor Cst is coupled (e.g., connected) to the second electrode of the first transistor M1.

The storage capacitor Cst charges a voltage corresponding to the data signal supplied to the first node N1 during each frame period.

The third transistor M3 is coupled (e.g., connected) between the first electrode AE of the organic light emitting diode OLED (or the second electrode of the first transistor M1) and the sensing line SENL. A gate electrode of the third transistor M3 is coupled (e.g., connected) to the sensing signal line SSL.

The third transistor M3 may transmit, to the sensing line SENL, a voltage value applied to the first electrode AE of the organic light emitting diode OLED according to a sensing signal supplied to the sensing signal line SSL during a set or predetermined sensing period. A voltage value transmitted through the sensing line SENL may be provided to an external circuit (e.g., a timing controller), and the external circuit may extract characteristic information (e.g., a threshold voltage of the first transistor M1, etc.) of each pixel PXL based on the provided voltage value. The extracted characteristic information may be utilized (e.g., used) to convert image data so that characteristic deviations between the pixels PXL are compensated. For example, the third transistor M3 may be a sensing transistor for detecting characteristic information of each pixel PXL.

Meanwhile, although FIG. 5 illustrates that the transistors included in the pixel circuit PXC, for example, the first, second, and third transistors M1, M2, and M3, are all N-type transistors (e.g., N-doped transistor), the present disclosure is not limited thereto. For example, at least one selected from the first, second, and third transistors M1, M2, and M3 may be changed to a P-type transistor (e.g., P-doped transistor). For example, the pixel circuit PXC may include a combination of P-type and N-type transistors.

In addition, the structure and driving method of the pixel PXL may be variously and suitably changed. For example, the pixel circuit PXC may include pixel circuits of various suitable structures and/or driving methods, in addition to the embodiment illustrated in FIG. 5.

For example, the pixel circuit PXC may not include the third transistor M3. In addition, the pixel circuit PXC may further include other circuit elements such as a compensation transistor for compensating the threshold voltage of the first transistor M1, etc., an initialization transistor for initializing the voltage of the first node N1 and/or the first electrode AE of the organic light emitting diode OLED, an emission control transistor for controlling a period in which the driving current is supplied to the organic light emitting diode OLED, and/or a boosting capacitor for boosting the voltage of the first node N1.

In another embodiment, when the pixel PXL is a pixel of a passive light emitting display device, the pixel circuit PXC may be omitted. In this case, the first electrode AE and the second electrode CE of the organic light emitting diode OLED may be directly coupled (e.g., directly connected) to the scan line SL, the data line DL, the first power line PL1, and the second power line PL2, and/or other signal lines or power lines.

The organic light emitting diode OLED includes a first electrode AE coupled (e.g., connected) to the first power supply voltage VDD through the pixel circuit PXC and the first power line PL1, and a second electrode CE coupled (e.g., connected) to second power supply voltage VSS through the second power line PL2. In addition, the organic light emitting diode OLED includes an organic emission layer between the first electrode AE and the second electrode CE.

The first power supply voltage VDD and the second power supply voltage VSS may have different potentials so that the organic light emitting diode OLED may emit light (e.g., so that current may flow from one selected from the first power supply voltage VDD and the second power supply voltage VSS to the other one selected from the first power supply voltage VDD and the second power supply voltage VSS). As an example, the first power supply voltage VDD may be a high-potential pixel power supply voltage, and the second power supply voltage VSS may be a low-potential pixel power supply voltage having a voltage lower than a threshold voltage of the organic light emitting element OLED compared with the potential of the first power supply voltage VDD. In this case, the first electrode AE of the organic light emitting diode OLED may be an anode electrode, and the second electrode CE of the organic light emitting diode OLED may be a cathode electrode.

When the driving current is supplied from the pixel circuit PXC, the organic light emitting diode OLED generates light having a luminance corresponding to the driving current. Therefore, each pixel PXL emits light having a luminance corresponding to the data signal supplied to the first node N1 during each frame period.

Meanwhile, when a data signal corresponding to a black gray scale is supplied to the first node N1 during the frame period, the pixel circuit PXC does not supply the driving current to the organic light emitting diode OLED. Therefore, the pixel PXL may maintain the non-emission state during the frame period.

Referring to FIG. 6, the pixel PXL may include an emission unit EMU including at least one inorganic light emitting diode NED coupled (e.g., connected) between the first power supply voltage VDD and the second power supply voltage VSS. As an example, the emission unit EMU may include a plurality of ultra-small inorganic light emitting diodes NED coupled (e.g., connected) in parallel to each other between the pixel circuit PXC and the second power supply voltage VSS. Each of the ultra-small inorganic light emitting diodes NED may have nano-scale to micro-scale sizes (e.g., diameter and/or length), but the present disclosure is not limited thereto. In addition, each of the ultra-small inorganic light emitting diodes NED may have a rod shape or a core shell shape, but the present disclosure is not limited thereto.

The emission unit EMU may include a first electrode ELT1 (also referred to as a "first alignment electrode" or a "first reflective electrode") coupled (e.g., connected) to the first power supply voltage VDD through the pixel circuit PXC and the first power line PL1, a second electrode ELT2 (also referred to as a "second alignment electrode" or a "second reflective electrode") coupled (e.g., connected) to the second power supply voltage VSS through the second power line PL2, and a plurality of inorganic light emitting diodes NED coupled (e.g., connected) between the first and second electrodes ELT1 and ELT2. According to an embodiment, the first electrode ELT1 of the emission unit EMU may be an anode electrode, and the second electrode ELT2 of the emission unit EMU may be a cathode electrode, but the present disclosure is not limited thereto.

In an embodiment, the emission unit EMU may include a plurality of inorganic light emitting diodes NED coupled (e.g., connected) in parallel between the first electrode ELT1 and the second electrode ELT2 in the same direction. For example, each of the inorganic light emitting diodes NED may include a first end EP1 (e.g., a P-type end (e.g., a P-doped end)) coupled (e.g., connected) to the first power supply voltage VDD through the first electrode ELT1 and/or the pixel circuit PXC, and a second end EP2 (e.g., an N-type end (e.g., an N-doped end)) coupled (e.g., connected) to the second power supply voltage VSS through the second electrode ELT2. For example, the inorganic light emitting diodes LD may be coupled (e.g., connected) in parallel between the first and second electrodes ELT1 and ELT2 in the forward direction to constitute each effective light source.

In addition, the emission unit EMU may further include at least one ineffective inorganic light emitting diode that is coupled (e.g., connected) between the first and second electrodes ELT1 and ELT2 in the reverse direction, or is not completely coupled (e.g., connected) between the first and second electrodes ELT1 and ELT2 at both ends. The at least one ineffective inorganic light emitting diode may maintain a non-emission state even when a driving current is supplied from the pixel circuit PXC.

Meanwhile, in another embodiment, at least one of the inorganic light emitting diodes NED constituting the effective light source of the emission unit EMU may be coupled (e.g., connected) between the first and second power supply voltages VDD and VSS in a first direction, and the others thereof may be coupled (e.g., connected) between the first and second power supply voltages VDD and VSS in a second direction opposite to the first direction. While changing the potentials of the first and second power supply voltages VDD and VSS, the inorganic light emitting diodes NED may be alternately driven.

In addition, although an embodiment in which the pixel PXL includes the emission unit EMU having a parallel structure is disclosed in FIG. 6, the present disclosure is not limited thereto. For example, the pixel PXL may include an emission unit EMU having a series structure or a series/parallel structure (e.g., a structure including electrical connections made in series and/or electrical connections made in parallel). In this case, the emission unit EMU may include inorganic light emitting diodes NED coupled (e.g., connected) in a series structure or a series/parallel structure between the first electrode ELT1 and the second electrode ELT2. For example, the inorganic light emitting diodes NED may be disposed and/or coupled (e.g., connected) to at least two serial stages.

FIGS. 7 to 10 are cross-sectional views illustrating a display panel DP according to an embodiment of the present disclosure, respectively. FIG. 11 is an enlarged cross-sectional view illustrating an area AR1 of FIG. 7.

Figure 7:
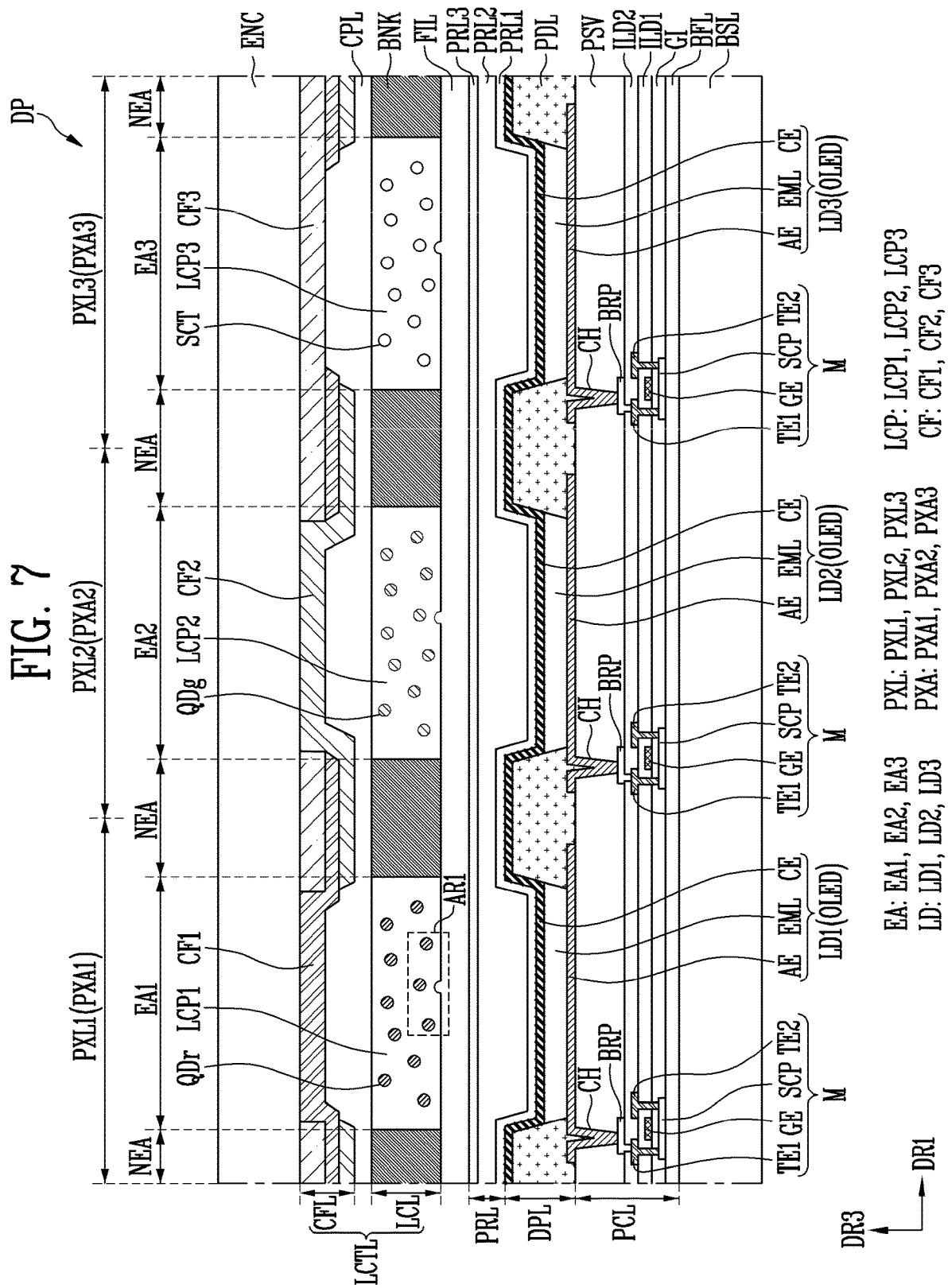
FIGS. 7-10 are cross-sectional views illustrating a display panel according to an embodiment of the present disclosure, respectively.
Figure 8:
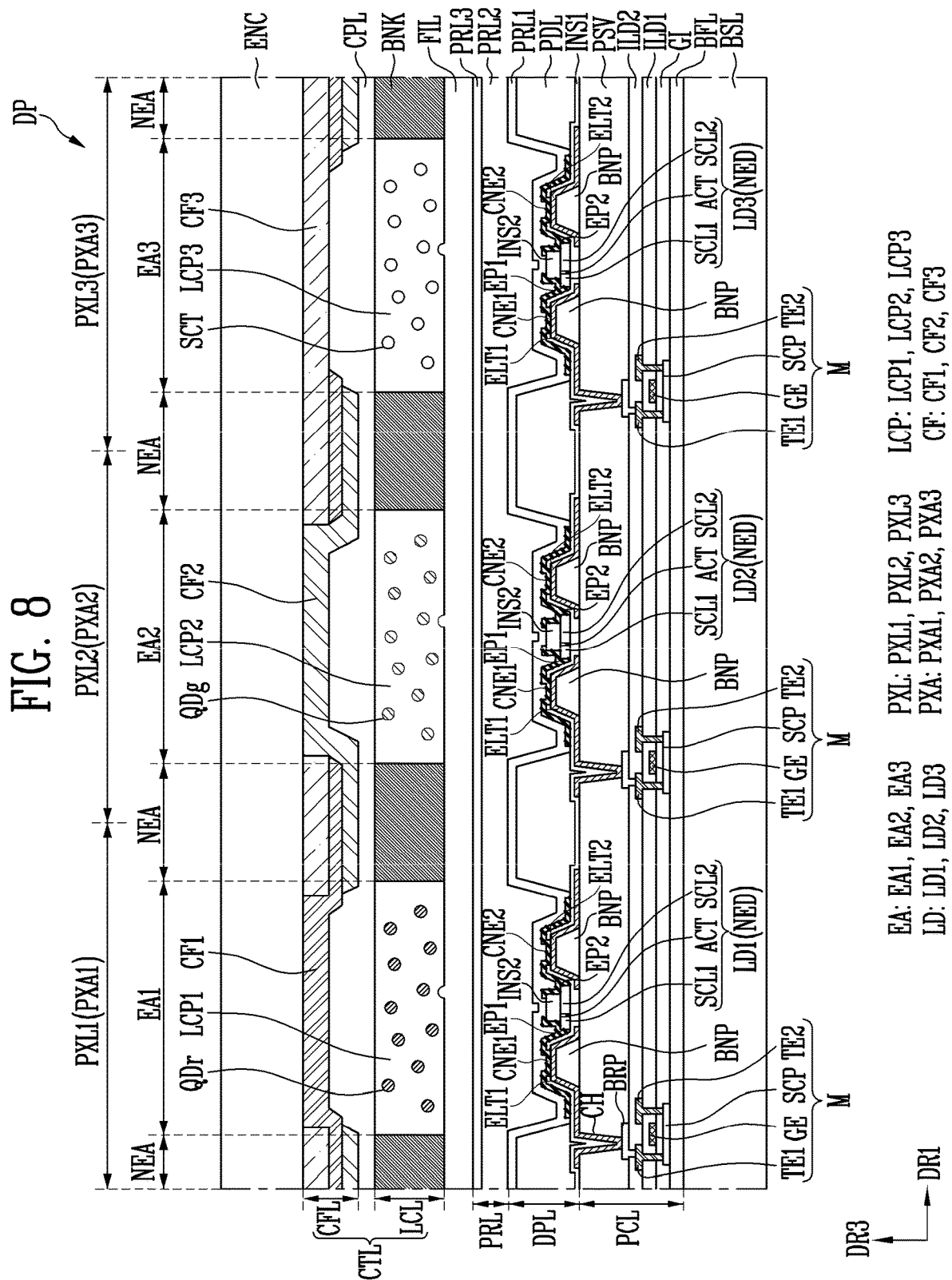

For example, as in the embodiment of FIG. 5, FIG. 7 illustrates the cross-section of the display panel DP focusing on one area of the first color pixel PXL1, the second color pixel PXL2, and the third color pixel PXL3 each including the organic light emitting diodes OLED. As in the embodiment of FIG. 6, FIG. 8 illustrates the cross-section of the display panel DP focusing on one area of the first color pixel PXL1, the second color pixel PXL2, and the third color pixel PXL3 each including the inorganic light emitting diodes NED.

Figure 9:
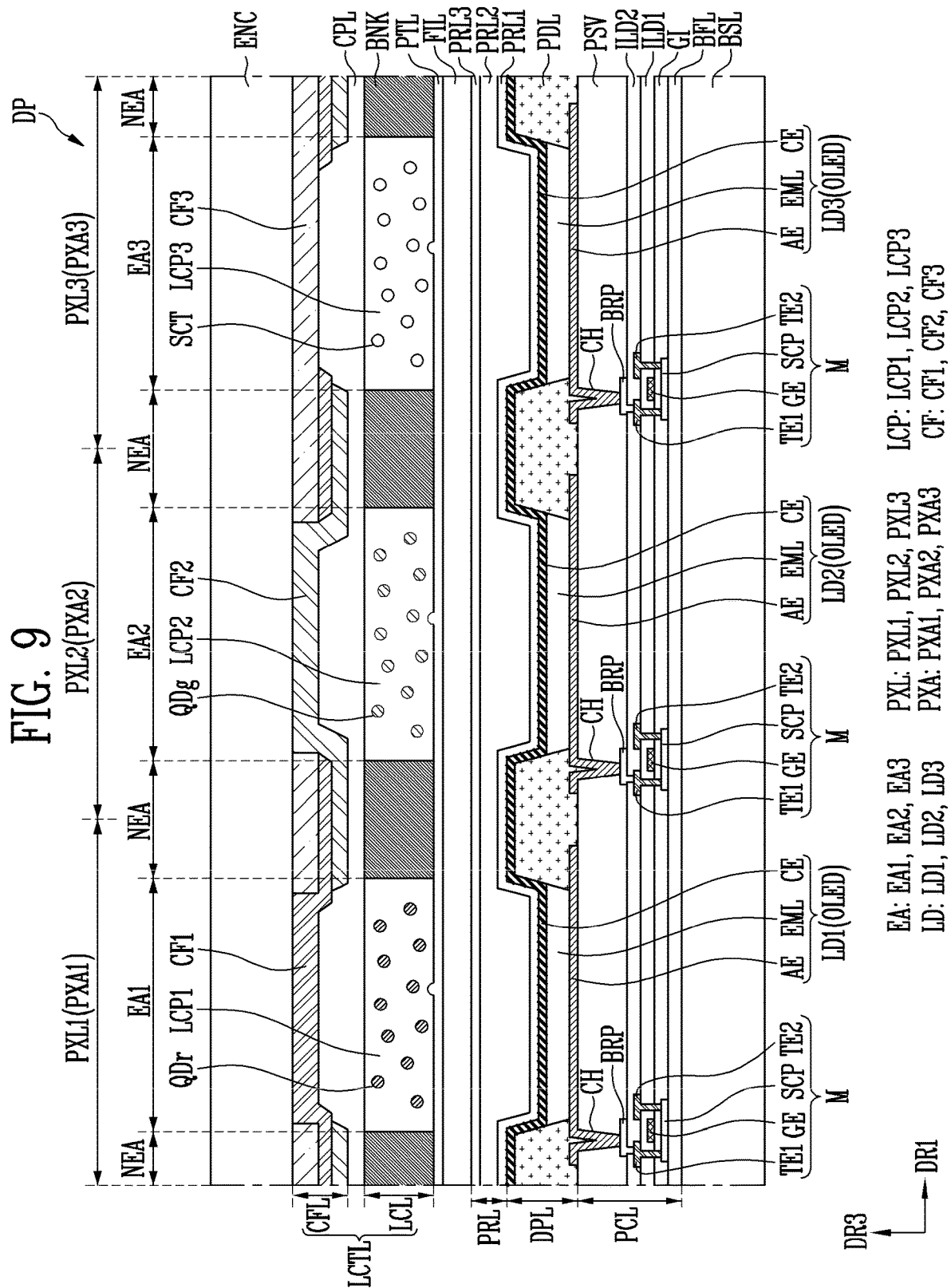
Figure 10:
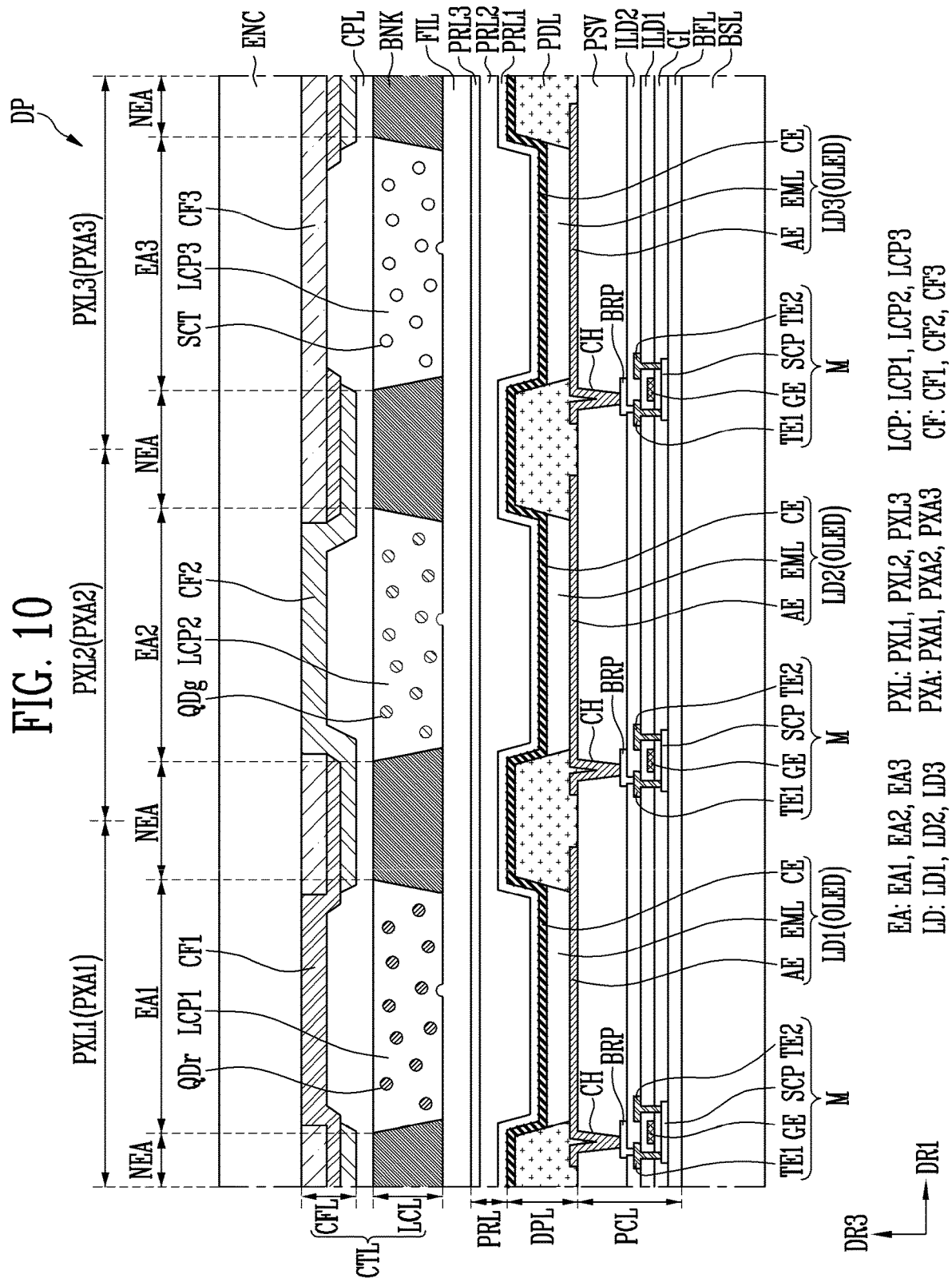
Figure 11:
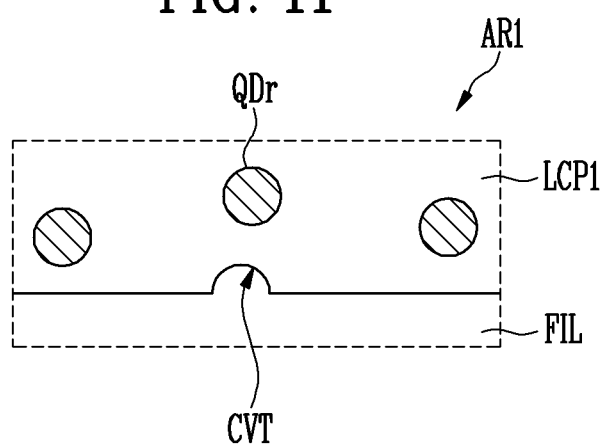
FIG. 11 is an enlarged cross-sectional view illustrating an area AR1 of FIG. 7.
Figure 12:
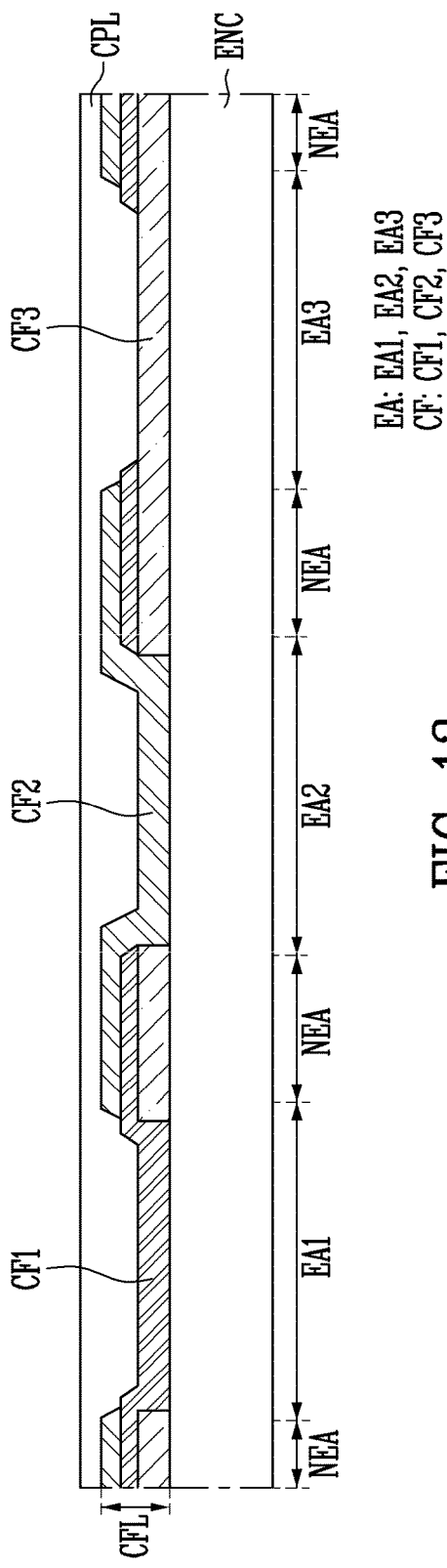
FIGS. 12-17 are cross-sectional views illustrating a method of fabricating a display device according to an embodiment of the present disclosure.
Figure 13:
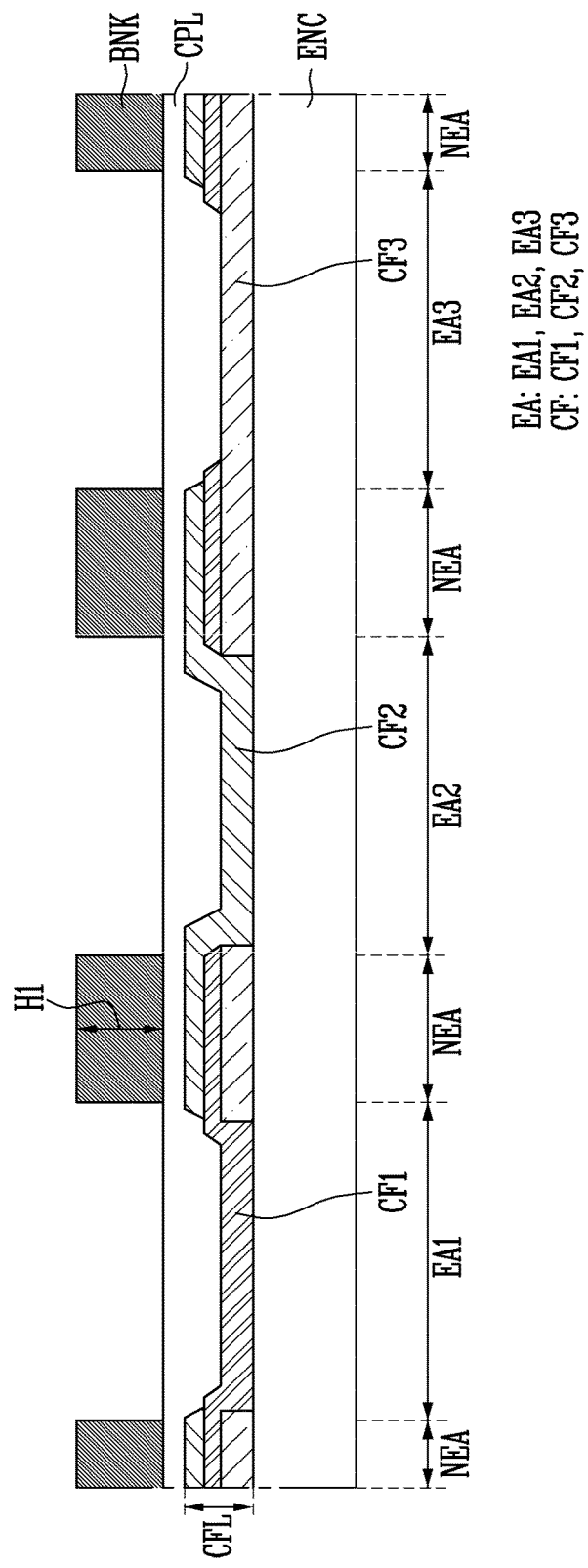

FIGS. 9 and 10 illustrate modified embodiments of the embodiment of FIG. 7. For example, the embodiment of FIG. 9 further includes a protective layer PTL provided on the surface of the light conversion layer LCL compared to the embodiment of FIG. 7. In the embodiment of FIG. 10, the shapes of the light conversion patterns LCP and the bank BNK are changed compared to the embodiment of FIG. 7. In addition, the embodiment of FIG. 9 and/or the embodiment of FIG. 10 may also be applied to the embodiment of FIG. 8.

FIGS. 7 to 10 illustrates the cross-section of the display panel DP according to each embodiment, focusing on one pixel unit PXU including the first color pixel PXL1 provided in a first pixel area PXA1, the second color pixel PXL2 provided in a second pixel area PXA2, and the third color pixel PXL3 provided in a third pixel area PXA3. The first color pixel PXL1 may include at least one first light emitting element LD1, the second color pixel PXL2 may include at least one second light emitting element LD2, and the third color pixel PXL3 may include at least one third light emitting element LD3.

Hereinafter, at least one selected from the first color pixel PXL1, the second color pixel PXL2, and the third color pixel PXL3 may be referred to as "pixel(s) PXL", or the first, second, and third color pixels PXL1, PXL2, and PXL3 may be collectively referred to as "pixel(s) PXL." Similarly, at least one selected from the first pixel area PXA1, the second pixel area PXA2, and the third pixel area PXA3 may be referred to as "pixel area(s) PXA", or the first, second, and third pixel areas PXA1, PXA2, and PXA3 may be collectively referred to as "pixel area(s) (PXA)". In addition, at least one selected from the first light emitting element LD1, the second light emitting element LD2, and the third light emitting element LD3 may be referred to as "light emitting element(s)", or the first, second, and third light emitting elements LD1, LD2, and LD3 may be collectively referred to as "light emitting element(s)".

In addition, in FIGS. 7 to 10, as an example of circuit elements that may be disposed on the pixel circuit layer PCL, a transistor M (e.g., the first transistor M1 of FIGS. 5 and 6) coupled (e.g., connected) to each light emitting element LD through each contact hole CH and/or bridge pattern BRP is illustrated. Meanwhile, the illustration of the first and second power lines PL1 and PL2 for supplying the first and second power supply voltages VDD and VSS to the pixels PX is omitted in FIGS. 7 to 10, but the first and second power lines PL1 and PL2 may also be disposed in the pixel circuit layer PCL. For example, the first and second power lines PL1 and PL2 may be disposed on the pixel circuit layer PCL, and may be coupled (e.g., connected) to the light emitting element LD of each of the pixels PXL through each pixel circuit PXC and/or at least one contact hole.

Although FIG. 11 representatively illustrates the area AR1 of FIG. 7, but even in the embodiments of FIGS. 8 to 10, at least one light conversion pattern LCP may include microcavities CVT of FIG. 11. In addition, although FIGS. 7 to 11 illustrate that all of the first, second, and third color pixels PXL1, PXL2, and PXL3 include the microcavities CVT, the present disclosure is not limited thereto. For example, at least one pixel PXL may not include microcavities CVT on the surface thereof.

Referring to FIGS. 1 to 11, the display panel DP may include a base layer BSL, and the display panel DP may include a pixel circuit layer PCL, a display element layer DPL, a protective layer PRL, a filler layer FIL, a light control layer LCTL, and an encapsulation layer ENC, which are sequentially disposed on a surface of the base layer BSL. In the embodiments of FIGS. 7 to 11, the encapsulation layer ENC may be an encapsulation substrate, but the present disclosure is not limited thereto. For example, in another embodiment, the encapsulation layer ENC may be changed to a thin film encapsulation layer.

In addition, the structure of the display panel DP may be variously and suitably changed according to embodiments. For example, in another embodiment, the display element layer DPL may be first disposed on a surface of the base layer BSL, and the pixel circuit layer PCL may be then disposed on the display element layer DPL. For example, the display element layer DPL and the pixel circuit layer PCL may be sequentially stacked on the base layer BSL. Additionally, some elements of the display panel DP may be omitted or replaced with other elements. For example, when the display panel DP is a display panel of a passive display device, the pixel circuit layer PCL may be omitted. In this case, lines for driving the pixels PXL may be directly coupled (e.g., connected) to and/or formed in the display element layer DPL.

In an embodiment, the pixel circuit layer PCL and the display element layer DPL may be formed and/or provided on a surface of the base layer BSL, and the light control layer LCTL may be formed and/or provided on a surface of the encapsulation layer ENC to face (e.g., overlap) the display element layer DPL. For example, the light control layer LCTL may be formed and/or provided on a surface of the encapsulation layer ENC facing the display element layer DPL. In addition, the filler layer FIL may be disposed between the display element layer DPL and the light control layer LCTL.

The base layer BSL is a base member for forming the pixels PXL, and may be a rigid or flexible substrate or film.

The pixel circuit layer PCL may be disposed on a surface of the base layer BSL. Circuit elements constituting the pixel circuit PXC of the pixel PXL and various suitable lines coupled (e.g., connected) thereto may be disposed in each pixel area PXA of the pixel circuit layer PCL. For example, the pixel circuit layer PCL may include a plurality of transistors M and a storage capacitor Cst that are disposed in each pixel area PXA and constitute the pixel circuit PXC of the pixel PXL. In addition, the pixel circuit layer PCL may further include at least one power line and/or at least one signal line coupled (e.g., connected) to each pixel circuit PXC and/or the light emitting element(s) LD. For example, the pixel circuit layer PCL may include various suitable signal lines including scan lines SL, data lines DL, sensing signal lines SSL, and/or sensing lines SENL of the pixels PXL, and power lines such as the first power line PL1 and the second power line PL2.

In addition, the pixel circuit layer PCL may include a plurality of insulating layers in addition to the circuit elements and the lines. For example, the pixel circuit layer PCL may include a buffer layer BFL, a gate insulating layer GI, a first interlayer insulating layer ILD1, a second interlayer insulating layer ILD2, and/or a passivation layer PSV, which are sequentially stacked on a surface of the base layer BSL. According to an embodiment, the passivation layer PSV may be formed entirely on the (e.g., on the entire) display area DA so as to cover the circuit elements of each pixel PXL and the lines coupled (e.g., connected) thereto, but the present disclosure is not limited thereto.

The buffer layer BFL may be provided on a surface of the base layer BSL on which the pixels PXL are to be formed. The buffer layer BFL may prevent or block impurities from diffusing into each circuit element.

A semiconductor layer may be provided on the buffer layer BFL. The semiconductor layer may include a semiconductor pattern SCP of each transistor M. The semiconductor pattern SCP may include a channel region overlapping each gate electrode GE, and first and second conductive regions (e.g., source and drain regions) disposed on both sides of the channel region.

According to an embodiment, the semiconductor pattern SCP may be a semiconductor pattern including (e.g., being) polysilicon (e.g., polycrystalline silicon), amorphous silicon, oxide semiconductor, and/or the like. In addition, the channel region of the semiconductor pattern SCP may be a semiconductor pattern that is not doped with impurities and may be an intrinsic semiconductor, and each of the first and second regions of the semiconductor pattern SCP may be a semiconductor pattern that is doped with set or predetermined impurities.

In an embodiment, the semiconductor patterns SCP of the transistors M constituting each pixel circuit PXC may include (e.g., be) substantially the same or similar material. For example, the semiconductor pattern SCP of the transistors M may include (e.g., be) the same material selected from among polysilicon (e.g., polycrystalline silicon), amorphous silicon, and oxide semiconductor.

In another embodiment, some transistors M and the other transistors M may include semiconductor patterns SCP including (e.g., being) different materials. For example, the semiconductor pattern SCP of some transistors M may include (e.g., be) polysilicon and/or amorphous silicon, and the semiconductor patterns SCP of the other transistors M may include (e.g., be) an oxide semiconductor.

The gate insulating layer GI may be disposed on the semiconductor layer. A first conductive layer may be disposed on the gate insulating layer GI.

The first conductive layer may include a gate electrode GE of each transistor M. The gate electrode GE may be disposed to overlap the semiconductor pattern SCP with the gate insulating layer GI therebetween. In addition, the first conductive layer may further include an electrode of the storage capacitor Cst and/or certain lines (e.g., scan lines SL).

The first interlayer insulating layer ILD1 may be disposed on the first conductive layer. A second conductive layer may be disposed on the first interlayer insulating layer ILD1.

The second conductive layer may include first and second transistor electrodes TE1 and TE2 of each transistor M. The first and second transistor electrodes TE1 and TE2 may be source and drain electrodes. In addition, the second conductive layer may further include an electrode of the storage capacitor Cst and/or certain lines (e.g., data lines DL and/or scan lines SL).

The second interlayer insulating layer ILD2 may be disposed on the second conductive layer. A third conductive layer may be disposed on the second interlayer insulating layer ILD2.

Each of the buffer layer BFL, the gate insulating layer GI, the first interlayer insulating layer ILD1, and the second interlayer insulating layer ILD2 may be provided with a single layer or multiple layers, and may include (e.g., be) at least one inorganic insulating material and/or at least one organic insulating material. For example, each of the buffer layer BFL, the gate insulating layer GI, the first interlayer insulating layer ILD1, and the second interlayer insulating layer ILD2 may include (e.g., be) various suitable types (e.g., kinds) of organic/inorganic insulating materials, including (e.g., being) silicon nitride ($SiN_x$), silicon oxide ($SiO_x$), and/or silicon oxynitride ($SiO_xN_y$). The third conductive layer may include a bridge pattern BRP and/or a certain line(s) (e.g., a first power line PL1 and/or a second power line PL2) coupling (e.g., connecting) the pixel circuit layer PCL to the display element layer DPL. The bridge pattern BRP may be coupled (e.g., connected) to the first electrodes AE and ELT1 of the light emitting element LD (e.g., the organic light emitting diode OLED or at least one ultra-small inorganic light emitting diode NED) of each pixel PXL through each contact hole CH.

Each of the conductive patterns, electrodes, and/or lines constituting the first to third conductive layers may have conductivity by including (e.g., being) at least one conductive material, and the constituent material is not particularly limited. For example, each of the conductive patterns, electrodes, and/or lines constituting the first to third conductive layers may include (e.g., be) at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu).

A passivation layer PSV may be disposed on the third conductive layer. The display element layer DPL may be disposed on the passivation layer PSV.

The passivation layer PSV may be provided with a single layer or multiple layers, and may include (e.g., be) at least one inorganic insulating material and/or at least one organic insulating material. For example, the passivation layer PSV may include (e.g., be) at least one organic insulating film and may substantially planarize the surface of the pixel circuit layer PCL. In an embodiment, the at least one organic insulating film may include (e.g., be) at least one selected from polyacrylates resin, epoxy resin, phenolic resin, polyamides resin, polyimides resin, unsaturated polyesters resin, poly-phenylene ethers resin, polyphenylene sulfides resin, and benzocyclobutene resin, but the present disclosure is not limited thereto.

The display element layer DPL may include light emitting elements LD of the pixels PXL and/or electrodes coupled (e.g., connected) thereto. For example, an organic light emitting diode OLED or a plurality of ultra-small inorganic light emitting diodes NED may be disposed in each pixel area PXA of the display element layer DPL. For example, each pixel PXL and each pixel area PXA corresponding thereto may include at least one emission area EA, and at least one light emitting element LD may be provided in the emission area EA.

In cases where the light emitting element LD of the pixel PXL is an organic light emitting diode OLED as in the embodiment of FIG. 5, the display element layer DPL may include an organic light emitting diode OLED formed in each pixel area PXA as illustrated in FIG. 7. For example, in the embodiment of FIG. 7, the display element layer DPL may include a light emitting element LD formed in each pixel area PXA, and the light emitting element LD may be an organic light emitting diode OLED. In this case, the light emitting element LD may include first and second electrodes AE and CE, and an emission layer EML disposed between the first and second electrodes AE and CE.

One selected from the first and second electrodes AE and CE may be an anode electrode, and the other thereof may be a cathode electrode. When the light emitting element LD is a top emission type (e.g., kind) organic light emitting diode (OLED), the first electrode AE may be a reflective electrode, and the second electrode CE may be a transmissive electrode. In an embodiment of the present disclosure, a case in which the light emitting element LD is a top emission type (e.g., kind) organic light emitting diode (OLED) and the first electrode AE is an anode electrode will be described as an example.

The first electrode AE may be coupled (e.g., connected) to a circuit element (e.g., the first transistor M1 of FIG. 5) of the pixel circuit layer PCL through the bridge pattern BRP and/or the contact hole CH penetrating through the passivation layer PSV. The first electrode AE may include a reflective film capable of reflecting light and/or a transparent conductive film disposed above or below the reflective film. For example, the first electrode AE may include multilayer conductive films including a lower transparent conductive film and an upper transparent conductive film including (e.g., being) indium tin oxide (ITO), and a reflective film provided between the lower transparent conductive film and the upper transparent conductive film and including (e.g., being) silver (Ag).

The display element layer DPL may further include a pixel defining layer PDL including an opening exposing a portion of the first electrode AE, for example, an upper surface of the first electrode AE. The pixel defining layer PDL may be an organic insulating film including (e.g., being) an organic material. For example, the pixel defining layer PDL may include an organic insulating film such as an acrylic resin, an epoxy resin, a phenolic resin, a polyamide resin, and/or a polyimide resin.

The emission layer EML may be disposed in an area corresponding to the opening of the pixel defining layer PDL. For example, the emission layer EML may be disposed on a surface of the exposed first electrode AE.

In an embodiment, the emission layer EML may have a multilayer thin film structure including at least a light generation layer. For example, the emission layer EML may include a hole injection layer that injects holes, a hole transport layer that has excellent hole transportability and increases the chance of recombination between holes and electrons by suppressing the movement of electrons that could not be bonded in the light generation layer, a light generation layer that emits light by recombination of injected electrons and holes, a hole blocking layer that suppresses the movement of holes that could not be recombined in the light generation layer, and an electron transport layer that smoothly transports electrons to the light generation layer, and an electron injection layer that injects electrons.

The light generation layer may be formed individually in the emission area of each pixel PXL, and the hole injection layer, the hole transport layer, the hole blocking layer, the electron transport layer, and the electron injection layer may be a common film coupled (e.g., connected) in emission areas adjacent to each other. However, in FIG. 7, the emission layer EML is illustrated based on the light generation layer.

A second electrode CE may be formed and/or provided on the emission layer EML. The second electrode CE may be a common film formed entirely in the (e.g., formed in the entire) display area DA including the plurality of pixel areas PXA, but the present disclosure is not limited thereto.

The second electrode CE is a transmissive electrode and may include (e.g., be) a transparent conductive material. The transparent conductive material may include (e.g., be) at least one selected from a transparent conductive oxide such as indium tin oxide (ITO), indium zinc oxide (IZO), zinc oxide (ZnO), and/or indium tin zinc oxide (ITZO); and a conductive polymer such as PEDOT, but the present disclosure is not limited thereto.

The pixel defining layer PDL may be disposed in a non-emission area NEA of each pixel PXL and/or the non-emission area NEA between the pixels PXL so as to surround or be around (e.g., partially or entirely surround) the emission area EA of each pixel PXL. For example, the pixel defining layer PDL may be a structure defining or partitioning the emission area EA of each of the pixels PXL. The pixel defining layer PDL may be configured to include (e.g., be) at least one light blocking material and/or at least one reflective material.

In cases where the light emitting element LD of the pixel PXL is an ultra-small inorganic light emitting diode NED as in the embodiment of FIG. 6, the display element layer DPL may include at least one light emitting element LD formed in each pixel area PXA, as illustrated in FIG. 8, and the light emitting element LD may be an ultra-small inorganic light emitting diode NED having a structure in which a nitride-based semiconductor is grown and has a size as small as micro-scale to nano-scale. In this case, the display element layer DPL includes bank patterns BNP, first and second electrodes ELT1 and ELT2, first and second insulating layers INS1 and INS2, and first and second contact electrodes CNE1 and CNE2. In an embodiment, each light emitting element LD may be a rod-shaped ultra-small inorganic light emitting diode NED having an aspect ratio greater than 1, but the present disclosure is not limited thereto.

The bank patterns BNP may be provided and/or formed on the passivation layer PSV, and may be positioned in the emission area EA of each pixel PXL. The bank patterns BNP may be disposed under an area of each of the first and second electrodes ELT1 and ELT2 and protrude an area of (e.g., cause a protrusion in the area of) each of the first and second electrodes ELT1 and ELT2 in the upper direction (e.g., the third direction DR3), so that the light emitted from the light emitting element(s) LD of each pixel PXL is guided to the image display direction of the display panel DP (e.g., the upper direction of each pixel PXL covering a certain viewing angle range). The bank patterns BNP may include an inorganic insulating film including (e.g., being) an inorganic material or an organic insulating film including (e.g., being) an organic material, and may include a single layer or multiple layers.

The first and second electrodes ELT1 and ELT2 may be disposed on the bank patterns BNP so as to partially overlap the bank patterns BNP and have a surface profile corresponding to the shape of the bank patterns BNP. The first and second electrodes ELT1 and ELT2 may include (e.g., be) a material having a uniform reflectance so that light emitted from each of the light emitting elements LD travels in the image display direction of the display panel DP.

The first electrode ELT1 may be electrically coupled (e.g., connected) to the pixel circuit PXC (e.g., the first transistor M1 of FIG. 6) through the contact hole CH penetrating through the passivation layer PSV and/or the bridge pattern BRP, and the second electrode ELT2 may be coupled (e.g., connected) to the second power line PL2 through at least one contact hole in an area. The first electrode ELT1 may be an anode electrode, and the second electrode ELT2 may be a cathode electrode.

At least one light emitting element LD may be disposed between the first and second electrodes ELT1 and ELT2. For example, the at least one light emitting element LD may be disposed between the first and second electrodes ELT1 and ELT2 in a horizontal direction (e.g., in the first direction DR1). For example, as in the embodiment of FIG. 6, a plurality of light emitting elements LD may be disposed between the first and second electrodes ELT1 and ELT2, and the light emitting elements LD may be coupled (e.g., connected) to each other in parallel. In another embodiment, the light emitting elements LD may be coupled (e.g., connected) to each other in series or in series/parallel.

Each of the light emitting elements LD may emit light of a certain color and/or white light. In an embodiment, the light emitting elements LD may be provided in a form sprayed in a solution and may be supplied to each pixel PXL.

Each of the light emitting elements LD may include a light emitting laminate including a first semiconductor layer SCL1 (e.g., a P-type semiconductor layer (e.g., a P-doped semiconductor layer)), an active layer ACT, and a second semiconductor layer SCL2 (e.g., an N-type semiconductor layer (e.g., an N-doped semiconductor layer)), which are sequentially disposed in one direction (e.g., a direction from the first end EP1 to the second end EP2). In addition, each of the light emitting elements LD may further include an insulating film surrounding or being around (e.g., partially or entirely surrounding) the outer circumferential surface of the light emitting laminate.

The first semiconductor layer SCL1 may include a first conductivity-type semiconductor layer (e.g., a semiconductor layer having a first kind of conductivity). For example, the first semiconductor layer SCL1 may include at least one p-type semiconductor layer (e.g., p-doped semiconductor layer). For example, the first semiconductor layer SCL1 may include (e.g., be) at least one semiconductor material selected from InAlGaN, GaN, AlGaN, InGaN, AlN, and InN, and may include a p-type semiconductor layer doped with a first conductivity-type dopant (or p-type dopant) such as Mg.

The active layer ACT may be formed in a single-quantum well structure or a multi-quantum well structure. According to an embodiment, a material such as AlGaN and/or AlInGaN (InAlGaN) may be utilized (e.g., used) to form the active layer ACT, and various suitable other materials may be utilized (e.g., used) to form the active layer ACT. The position of the active layer ACT may be variously and suitably changed according to the type (e.g., kind) of the light emitting element LD. The active layer ACT may emit light having a wavelength of about 400 nm to about 900 nm, and may utilize (e.g., use) a double hetero-structure.

The second semiconductor layer SCL2 may include a semiconductor layer of a different type (e.g., kind) from the first semiconductor layer SCL1. For example, the second semiconductor layer SCL2 may include at least one n-type semiconductor layer (e.g., n-doped semiconductor layer). For example, the second semiconductor layer SCL2 may include (e.g., be) at least one semiconductor material selected from InAlGaN, GaN, AlGaN, InGaN, AlN, and InN, and may be an n-type semiconductor layer to which a second conductivity-type dopant (or n-type dopant) such as Si, Ge, and/or Sn is doped.

The light emitting elements LD may be provided and/or formed on the first insulating layer INS1. The first insulating layer INS1 may be provided and/or formed between each of the first and second electrodes ELT1 and ELT2 and the passivation layer PSV (e.g., between the first electrode ELT1 and the passivation layer PSV and between the second electrode ELT2 and the passivation layer PSV). The first insulating layer INS1 may stably support the light emitting elements LD by filling a space between each of the light emitting elements LD and the passivation layer PSV. The first insulating layer INS1 may include (e.g., be) at least one inorganic insulating material and/or at least one organic insulating material, and may include a single layer or multiple layers.

The second insulating layer INS2 may be disposed on an area of the light emitting elements LD. The second insulating layer INS2 may be provided and/or formed on the light emitting elements LD to cover a portion of the upper surface of each of the light emitting elements LD and expose the first and second ends EP1 and EP2 of each of the light emitting elements LD. The second insulating layer INS2 may stably fix the light emitting elements LD. When an empty space exists between the first insulating layer INS1 and the light emitting elements LD before the formation of the second insulating layer INS2, the empty space may be at least partially filled by the second insulating layer INS2. The first contact electrode CNE1 that electrically and/or physically stably couples (e.g., connects) the first electrode ELT1 to an end (e.g., the first end EP1) of both ends of a corresponding light emitting element LD may be disposed on the first electrode ELT1. The second contact electrode CNE2 that electrically and/or physically stably couples (e.g., connects) the second electrode ELT2 to an end (e.g., the second end EP2) of both ends of a corresponding light emitting element LD may be disposed on the second electrode ELT2. The first insulating layer INS1 may be removed in an area in which the first electrode ELT1 and the first contact electrode CNE1 are coupled (e.g., connected) and an area in which the second electrode ELT2 and the second contact electrode CNE2 are coupled (e.g., connected).

The first and second contact electrodes CNE1 and CNE2 may include (e.g., be) a transparent conductive material so that light emitted from each of the light emitting elements LD and reflected by the first and second electrodes ELT1 and ELT2 travels toward the image display of the display device without loss or with reduced loss. The transparent conductive material may include (e.g., be) at least one selected from a transparent conductive oxide such as indium tin oxide (ITO), indium zinc oxide (IZO), zinc oxide (ZnO), and/or indium tin zinc oxide (ITZO); and a conductive polymer such as PEDOT, but the present disclosure is not limited thereto.

A protective layer PRL (or an overcoat layer) may be provided and/or formed on the display element layer DPL including the light emitting elements LD of the pixels PXL.

The protective layer PRL may include a single layer or multiple layers. In an embodiment, the protective layer PRL may include a plurality of insulating films covering the display element layer DPL. For example, the protective layer PRL may include at least one inorganic film and at least one organic film.

For example, the protective layer PRL may have a structure in which an inorganic film and an organic film are alternately stacked. In an embodiment, the protective layer PRL may include first, second, and third protective layers PRL1, PRL2, and PRL3 sequentially stacked on the display element layer DPL. In an embodiment, the first and third protective layers PRL1 and PRL3 may each include an inorganic film including (e.g., being) an inorganic material, and the second protective layer PRL2 may include an organic film including (e.g., being) an organic material.

The filler layer FIL may be provided on the protective layer PRL. For example, the filler layer FIL may be provided between a surface of the base layer BSL, on which the pixels PXL are provided, and a surface of the encapsulation layer ENC, on which the light control layer LCTL is provided. For example, the filler layer FIL including (e.g., being) a material having a relatively low refractive index (index of refraction) so that light emitted from the light emitting elements LD may be smoothly emitted in the upper direction of the pixels PXL may be disposed between a lower panel of the display panel DP including the base layer BSL, the pixel circuit layer PCL, the display element layer DPL, and/or the protective layer PRL and an upper plate of the display panel DP including the encapsulation layer ENC and the light control layer LCTL. In another embodiment, the protective layer PRL may be integrated with the filler layer FIL. In this case, the upper plate of the display panel DP including the encapsulation layer ENC and the light control layer LCTL may be disposed on the protective layer PRL so as to be in contact with the protective layer PRL (and/or the filler layer FIL). The filler layer FIL may be formed to have a thickness capable of stably protecting the light conversion layer LCL, and may be formed to be substantially flat.

In an embodiment, the filler layer FIL may include (e.g., be) an epoxy and/or a siloxane-based filler, but the present disclosure is not limited thereto. The filler layer FIL may include (e.g., be) a material having a relatively low refractive index (e.g., about 1.5 to about 1.6) so that the light emitted from the pixels PXL may be smoothly emitted in the front direction of the display panel PNL, for example the third direction DR3.

The light control layer LCTL may be provided on the filler layer FIL. The light control layer LCTL may include a light conversion layer LCL and a color filter layer CFL sequentially disposed on the pixels PXL, the protective layer PRL, and/or the filler layer FIL. In addition, a capping layer CPL may be provided between the light conversion layer LCL and the color filter layer CFL.

The light conversion layer LCL may include light conversion patterns LCP (also referred to as "color conversion patterns" or "wavelength conversion patterns") provided on (e.g., in) the emission areas EA of the pixels PXL, and a bank BNK provided between the light conversion patterns LCP so as to surround or be around (e.g., partially or entirely surround) the side surfaces of the light conversion patterns LCP.

The light conversion patterns LCP may include a first light conversion pattern LCP1 provided on an emission area EA1 of the first color pixel PXL1, a second light conversion pattern LCP2 provided on an emission area EA2 of the second color pixel PXL2, and a third light conversion pattern LCP3 provided on an emission area EA3 of the third color pixel PXL3. The first, second, and third light conversion patterns LCP1, LCP2, and LCP3 may be formed in a separate pattern corresponding to each pixel PXL, and may be around or surrounded (e.g., partially or entirely surrounded) by the light-shielding bank BNK.

In an embodiment, as illustrated in FIG. 9, a protective layer PTL may be provided on the surfaces (e.g., lower surfaces) of the first, second, and third light conversion patterns LCP1, LCP2, and LCP3 and/or the bank BNK. The protective layer PTL may be provided as a capping layer for protecting the first, second, and third light conversion patterns LCP1, LCP2, and LCP3. The protective layer PTL may include (e.g., be) at least one inorganic insulating material and/or at least one organic insulating material, and may include a single layer or multiple layers.

In an embodiment, the first, second, and third pixels PXL1, PXL2, and PXL3 may include light emitting elements LD that emit light of the same color, and at least one selected from the first, second, and third light conversion patterns LCP1, LCP2, and LCP3 may include color conversion particles corresponding to a certain color (or wavelength). For example, each of the first, second, and third pixels PXL1, PXL2, and PXL3 may include at least one blue light emitting device that emits blue light belonging to a wavelength band of about 400 nm to about 500 nm. Each of the first and second light conversion patterns LCP1 and LCP2 may include color conversion particles corresponding to a certain color. For example, the first light conversion pattern LCP1 may include red color conversion particles to convert blue light to red light, and the second light conversion pattern LCP2 may include green color conversion particles to convert blue light to green light. Accordingly, even when all the pixels PXL include the light emitting elements LD of the same color, the display panel DP may display a full-color image. Meanwhile, the third light conversion pattern LCP3 may or may not include color conversion particles. For example, the third light conversion pattern LCP3 may not include color conversion particles, but may include only light scattering particles SCT.

The first light conversion pattern LCP1 (also referred to as "first color conversion pattern" or "first color conversion layer") may be provided on the emission area EA1 of the first color pixel PXL1. The first light conversion pattern LCP1 may convert light emitted from the light emitting element(s) LD1 of the first color pixel PXL1 into light of a different color. To this end, the first light conversion pattern LCP1 may be disposed on the emission area EA1 of the first color pixel PXL1 and may include first color conversion particles (e.g., quantum dots of a first color). For example, when the light emitting element(s) LD1 provided in each of the first color pixels PXL1 are blue light emitting element(s) that emit blue light and the first color pixel PXL1 is a red pixel, the first light conversion pattern LCP1 may include red quantum dots QDr for converting blue light emitted from the blue light emitting element(s) into red light.

For example, the first light conversion pattern LCP1 may include a plurality of red quantum dots QDr dispersed in a certain matrix material such as a transparent resin. The red quantum dots QDr may absorb blue light and shift a wavelength according to an energy transition to emit red light having a wavelength band of about 620 nm to about 780 nm. Meanwhile, when the first color pixel PXL1 is a pixel of a different color, the first light conversion pattern LCP1 may include color conversion particles of a different color corresponding to the color of the first color pixel PXL1.

In an embodiment, the first light conversion pattern LCP1 may include one type (e.g., kind) of color conversion particles, but the present disclosure is not limited thereto. For example, the first light conversion pattern LCP1 may compositely include at least two types (e.g., kinds) of color conversion particles having different emission spectra (e.g., peak wavelengths). In addition, the first light conversion pattern LCP1 may optionally include light scattering particles (e.g., light scattering particles of the types (e.g., kinds) identical to or different from the light scattering particles SCT included in the third light conversion pattern LCP3).

The second light conversion pattern LCP2 (also referred to as "second color conversion pattern" or "second color conversion layer") may be provided on the emission area EA2 of the second color pixel PXL2. The second light conversion pattern LCP2 may convert light emitted from the light emitting element(s) LD2 of the second color pixel PXL2 into light of a different color. To this end, the second light conversion pattern LCP2 may be disposed on the emission area EA2 of the second color pixel PXL2 and may include second color conversion particles (e.g., quantum dots of a second color). For example, when the light emitting element(s) LD2 provided in each of the second color pixels PXL2 is blue light emitting element(s) that emit blue light and the second color pixel PXL2 is a green pixel, the second light conversion pattern LCP2 may include green quantum dots QDg for converting blue light emitted from the blue light emitting element(s) into green light.

For example, the second light conversion pattern LCP2 may include a plurality of green quantum dots QDg dispersed in a certain matrix material such as a transparent resin. The green quantum dots QDg may absorb blue light and shift a wavelength according to an energy transition to emit green light having a wavelength band of about 500 nm to about 570 nm. Meanwhile, when the second color pixel PXL2 is a pixel of a different color, the second light conversion pattern LCP2 may include color conversion particles of a different color corresponding to the color of the second color pixel PXL2.

In an embodiment, the second light conversion pattern LCP2 may include one type (e.g., kind) of color conversion particles, but the present disclosure is not limited thereto. For example, the second light conversion pattern LCP2 may compositely include at least two types (e.g., kinds) of color conversion particles having different emission spectra. In addition, the second light conversion pattern LCP2 may optionally include light scattering particles (e.g., light scattering particles of the types (e.g., kinds) identical to or different from the light scattering particles SCT included in the third light conversion pattern LCP3).

The third light conversion pattern LCP3 (also referred to as "light scattering layer") may be provided on the emission area EA3 of the third color pixel PXL3. In an embodiment, when the light emitting element(s) LD3 provided in each of the third color pixels PXL3 is blue light emitting element(s) that emit blue light and the third color pixel PXL3 is a blue pixel, the third light conversion pattern LCP3 may be optionally included so as to efficiently utilize (e.g., use) light emitted from the blue light emitting element(s). The third light conversion pattern LCP3 may include at least one type (e.g., kind) of light scattering particles SCT.

For example, the third light conversion pattern LCP3 may include a plurality of light scattering particles SCT dispersed in a certain matrix material. For example, the third light conversion pattern LCP3 may include light scattering particles SCT such as titanium dioxide ($TiO_2$), titanium oxide ($Ti_xO_y$), and/or silica, but the present disclosure is not limited thereto.

Meanwhile, the light scattering particles SCT do not have to be provided only to the third light conversion pattern LCP3. For example, the first light conversion pattern LCP1 and/or the second light conversion pattern LCP2 may also optionally further include light scattering particles SCT. For example, each light conversion pattern LCP may include at least one selected from color conversion particles and light scattering particles SCT.

When seen at least from a plan view, the bank BNK may be disposed on the non-emission areas NEA of the pixels PXL so as to surround or be around (e.g., partially or entirely surround) each light conversion pattern LCP. For example, the bank BNK may include a plurality of openings corresponding to the first, second, and third light conversion patterns LCP1, LCP2, and LCP3, and may be provided between the first, second, and third light conversion patterns LCP1, LCP2, and LCP3. For example, the bank BNK may have a mesh shape.

The bank BNK may include (e.g., be) at least one black matrix material. For example, the bank BNK may include (e.g., be) at least one black matrix material among various suitable types (e.g., kinds) of black matrix materials, and/or the bank BNK may include (e.g., be) a color filter material of a set or specific color. For example, the bank BNK may be a black matrix pattern formed in a black opaque pattern capable of blocking transmission of light.

In an embodiment, as in the embodiments of FIGS. 7 to 9, the light conversion patterns LCP and the bank BNK may have sidewalls substantially normal (e.g., perpendicular) to (e.g., protruding in the third direction DR3) the main surface of the base layer BSL (e.g., a plane defined by the first and second directions DR1 and DR2). For example, the light conversion patterns LCP and the bank BNK may have a substantially rectangular shape in a cross-section (e.g., in a cross-sectional view). In this case, the aperture ratio of the pixels PXL may be improved by reducing or minimizing the area of the bank BNK.

In another embodiment, the light conversion patterns LCP and the bank BNK may have sidewalls having an inclined surface shape inclined in a diagonal direction with respect to the main surface of the base layer BSL, as in the embodiment of FIG. 10. For example, the light conversion patterns LCP and the bank BNK may have a tapered or inverted tapered shape, and may have a substantially trapezoidal shape in a cross-section (e.g., in a cross-sectional view). However, the present disclosure is not limited thereto. For example, in still another embodiment, the light conversion patterns LCP and the bank BNK may have curved sidewalls. For example, the light conversion patterns LCP and the bank BNK may have a cross-section having a semicircular or semi-elliptical shape. In some embodiments, the sidewalls of the light conversion patterns LCP and of the bank BNK may each be parallel to a direction normal (e.g., perpendicular) to an upper surface of the base layer BSL. In some embodiments, the sidewalls of the light conversion patterns LCP and of the bank BNK may form an angle with an upper surface of a layer that the bank BNK is on (e.g., directly on) within a range of greater than 0° and less than 180°.

In an embodiment, the bank BNK may have a tapered shape in which the area (or the width in the first and/or second directions DR1, DR2) gradually widens as the distance to the pixels PXL decreases. For example, a horizontal width (e.g., width in the first direction DR1) of the bank BNK may decrease along the third direction DR3 away from the display element layer DPL. In this case, when the bank BNK is formed on a side of the encapsulation layer ENC, the bank BNK may be formed in an inverted tapered shape, and may have a tapered shape as the bank BNK is vertically inverted to face (e.g., overlap) the pixels PXL. For example, a surface (e.g., lower surface) of the bank BNK facing the display element layer DPL may be greater in horizontal width and/or planar area than a surface (e.g., upper surface) of the bank BNK facing away from the display element layer DPL. When the area of the bank BNK gradually increases as the distance to the pixels PXL decreases, it is possible to effectively prevent or reduce the occurrence of color mixture or light leakage between the adjacent pixels PXL.

The light conversion patterns LCP may have a shape matching the shape of the bank BNK. For example, the light conversion patterns LCP may fill openings in the bank BNK to have a corresponding shape of the openings in the bank BNK. For example, when the bank BNK has a tapered shape, the light conversion patterns LCP may have an inverted tapered shape, and when the bank BNK has an inverse tapered shape, the light conversion patterns LCP may have a tapered shape.

The color filter layer CFL may include first, second, and third color filters CF1, CF2, and CF3 provided on the first, second, and third light conversion patterns LCP1, LCP2, and LCP3.

The first color filter CF1 may be disposed on the first light conversion pattern LCP1 and may include (e.g., be) a color filter material that selectively transmits light of a color corresponding to the color of the first color pixel PXL1. For example, when the first color pixel PXL1 is a red pixel and the first light conversion pattern LCP1 includes red quantum dots QDr that convert light of a different color (e.g., blue) emitted from the light emitting elements LD of the first color pixel PXL1 into red light, the first color filter CF1 may be a red color filter that selectively transmits red light emitted from the first light conversion pattern LCP1.

The second color filter CF2 may be disposed on the second light conversion pattern LCP2 and may include (e.g., be) a color filter material that selectively transmits light of a color corresponding to the color of the second color pixel PXL2. For example, when the second color pixel PXL2 is a green pixel and the second light conversion pattern LCP2 includes green quantum dots that convert light of a different color (e.g., blue) emitted from the light emitting elements LD of the second color pixel PXL2 into green light, the second color filter CF2 may be a green color filter that selectively transmits green light emitted from the second light conversion pattern LCP2.

The third color filter CF3 may be disposed on the third light conversion pattern LCP3 and may include (e.g., be) a color filter material that selectively transmits light of a color corresponding to the color of the third color pixel PXL3. For example, when the third color pixel PXL3 is a blue pixel and blue light is emitted from the light emitting elements LD of the third color pixel PXL3 and from the third light conversion pattern LCP3, the third color filter CF3 may be a blue color filter that selectively transmits blue light emitted from the third light conversion pattern LCP3.

In an embodiment, at least two types (e.g., kinds) of color filters CF may be disposed to overlap each other in the non-emission area NEA between the emission areas EA. Therefore, the at least two types (e.g., kinds) of color filters CF may constitute a light blocking pattern. For example, the first, second, and third color filters CF1, CF2, and CF3 may be provided to overlap each other on the non-emission area NEA to constitute a multilayered light blocking pattern. However, the present disclosure is not limited thereto. For example, in another embodiment, a separate light blocking pattern may be provided between the color filters CF.

According to an embodiment, the capping layer CPL may be provided on the surfaces of the color filters CF. For example, the capping layer CPL may be provided between the color filter layer CFL and the light conversion layer LCL.

The capping layer CPL may be a protective layer for protecting the color filter layer CFL. In addition, the capping layer CPL may be a low refractive index layer (or a refractive index matching layer) including (e.g., being) a low refractive index material in order to improve light emission characteristics of the pixels PXL. In some embodiments, the capping layer CPL may have a refractive index that matches (e.g., is substantially the same as) a refractive index of the color filter layer CFL and/or of the light conversion patterns LCP.

The encapsulation layer ENL may be on the color filter layer CFL. For example, the encapsulation layer ENC may be an encapsulation substrate that is disposed on a surface of the base layer BSL to seal the display area DA, on which the pixels PXL are provided, and is coupled (e.g., attached) to and/or bonded to the base layer BSL.

In embodiments of the present disclosure, the surface (e.g., the upper surface and/or lower surface) of the light conversion layer LCL including the light conversion patterns LCP and the bank BNK may be substantially flat. For example, the light conversion layer LCL may have a substantially flat surface on a side facing the pixels PXL (e.g., a side of the light conversion layer LCL contacting the filler layer FIL or the protective layer PTL). For example, on a surface of the light conversion layer LCL facing the pixels PXL, the surfaces of the light conversion patterns LCP and the bank BNK may be positioned at the same height based on the base layer BSL (or the encapsulation layer ENC). For example, a distance (e.g., a vertical distance, for example, a distance in the third direction DR3) between an upper surface of the base layer BSL (or a lower surface of the encapsulation layer ENC) and a lower surface of the light conversion layer LCL facing the base layer BSL (e.g., a lower surface of the light conversion patterns LCP and lower a surface of the bank BNK facing the base layer BSL) may be uniform.

In an embodiment, the light conversion patterns LCP and the bank BNK may have substantially the same thickness. For example, the thickness of the light conversion patterns LCP and the bank BNK in a vertical direction (e.g., the third direction DR3) may be uniform. For example, when the capping layer CPL covering the surface of the color filter layer CFL has a substantially flat surface and the light conversion patterns LCP and the bank BNK are directly formed respectively in the emission areas EA and the non-emission area NEA on the capping layer CPL, the light conversion patterns LCP and the bank BNK may have substantially the same thickness and may be positioned at substantially the same height. Accordingly, the surface of the light conversion layer LCL may be substantially flat.

In cases where the light conversion layer LCL has a flat (e.g., substantially flat) surface, the thickness of the filler layer FIL may be reduced compared with the case in which the light conversion layer LCL has an uneven surface due to the height difference between the light conversion patterns LCP and the bank BNK (e.g., due to a step shape between a surface of the light conversion patterns LCP and a surface of the bank BNK).

For example, when the height difference occurs between the light conversion patterns LCP and the bank BNK, and accordingly, the light conversion layer LCL has an uneven surface, the filler layer FIL has to be formed to a sufficient thickness to fill the height difference between the light conversion patterns LCP and the bank BNK while stably covering foreign matter that may occur (e.g., accumulate) on the surface of the light conversion layer LCL during the process of forming the light conversion layer LCL. As an example, in case that a height difference of about 1.5 μm occurs between the light conversion patterns LCP and the bank BNK, the filler layer FIL may be formed to have a thickness of about 3 μm or more in order to stably cover the surface of the light conversion layer LCL while filling the height difference.

When the thickness of the filler layer FIL increases, the loss of light generated in each pixel PXL may increase. Therefore, light efficiency (e.g., light emission efficiency) of the pixels PXL may be reduced.

On the other hand, in cases where the light conversion layer LCL has a flat (e.g., substantially flat) surface as in the embodiments of the present disclosure, the light conversion patterns LCP and the bank BNK have substantially no height difference, thereby minimizing or reducing the thickness of the filler layer FIL. For example, in the display panel DP according to the embodiments, the filler layer may have a thickness of about 1.5 μm to about 3 μm, for example, about 1.5 μm. As the thickness of the filler layer FIL decreases, the loss of light generated in each pixel PXL may be reduced. Therefore, light emission efficiency of light generated in the pixels PXL may be improved.

For example, as a result of an experiment on a 65-inch OLED panel, when the thickness of the filler layer FIL decreases from about 3 μm to about 1.5 μm, each pixel PXL may have improved light emission efficiency corresponding to about 4% to about 6.25%. For example, when the thickness of the filler layer FIL is reduced from about 3 μm to about 1.5 μm, the light emission efficiency improvement effect of about 5.6% may be obtained in the case of red pixels, the light emission efficiency improvement effect of about 5.8% may be obtained in the case of green pixels, the light emission efficiency improvement effect of about 4% may be obtained in the case of blue pixels, and the light emission efficiency improvement effect of about 6.25% may be obtained in the case of white pixels. The exemplified values may be changed depending on the product, but the light emission efficiency may increase as the thickness of the filler layer FIL decreases even in other products.

In addition, in the embodiments of the present disclosure, the bank BNK is formed to a sufficient thickness (or height) in order to stably partition unit areas (e.g., emission areas EA) in which the light conversion patterns LCP are to be formed, and then, the bank BNK may be removed by a certain thickness during a planarization process for removing the step difference with respect to the light conversion patterns LCP. Therefore, the thickness of the bank BNK may be reduced.

In cases where the height difference between the light conversion patterns LCP and the bank BNK is removed and thus the thickness of the bank BNK decreases, light loss caused by the bank BNK may be reduced. Accordingly, it is possible to further improve the light efficiency (e.g., light emission efficiency) of the pixels PXL.

In addition, as the thickness of the bank BNK decreases, it is possible to prevent the bank BNK from being peeled off or to reduce peeling of the bank BNK. Therefore, light leakage may be reduced or prevented, and defects of the display panel DP may be prevented or reduced.

In an embodiment of the present disclosure, the light conversion layer LCL has a substantially flat surface, and the at least one light conversion pattern LCP may include at least one microcavity CVT formed on the surface thereof. The microcavities CVT may be generated in a polishing process for planarizing the light conversion layer LCL. For example, the microcavities CVT may be generated when at least one color conversion particle (e.g., red quantum dot QDr and/or green quantum dot QDg) and/or the light scattering particle SCT is separated and removed from the polished surface of the light conversion layer LCL. In this case, each microcavity CVT may have a size (e.g., diameter, breadth, and/or volume) less than or equal to the size of the color conversion particles and/or the light scattering particles SCT. For example, each microcavity CVT may have a size less than or equal to the size of each color conversion particle or light scattering particle SCT.

FIGS. 12 to 17 are cross-sectional views illustrating a method of fabricating a display device DD according to an embodiment of the present disclosure. For example, FIGS. 12 to 17 sequentially illustrate a method of fabricating the upper plate of the display panel DP according to the embodiment of FIG. 9. The upper plate of the display panel DP according to the embodiments of FIGS. 7, 8, and 10 may also be formed in a manner substantially similar to the embodiments disclosed in FIGS. 12 to 17.

In the embodiments of FIGS. 7 to 10 described above, the display panel DP may include an upper plate including an encapsulation layer ENC and a light control layer LCTL, and a lower plate including a base layer BSL, a pixel circuit layer PCL, a display element layer DPL, and/or a protective layer PRL. According to an embodiment, the filler layer FIL may be included in the upper plate or the lower panel of the display panel DP, or may be regarded as an intermediate layer disposed between the upper plate and the lower plate of the display panel DP. In an embodiment, the filler layer FIL may be formed to cover a surface of the upper plate on which the light control layer LCTL is formed in the process of forming the upper plate of the display panel DP.

Meanwhile, in the embodiments of FIGS. 7 to 10 and the embodiments of FIGS. 12 to 17, embodiments in which the encapsulation layer ENC is an encapsulation substrate, and the upper plate and the lower plate of the display panel DP are separately fabricated and then the display panel DP is fabricated through a process of coupling (e.g., attaching) the upper plate and the lower plate will be described as an example. However, the present disclosure is not limited thereto. For example, in another embodiment, an encapsulation layer ENC may be a thin film encapsulation layer. After pixels PXL are fabricated by forming a pixel circuit layer PCL and a display element layer DPL on a surface of a base layer BSL, a protective layer PRL, a filler layer FIL, a light control layer LCTL, and/or a thin film encapsulation layer may be directly formed on a surface of the base layer BSL on which the pixels PXL are formed (e.g., directly formed on the display element layer DPL).

Referring to FIGS. 1 to 12, the encapsulation layer ENC (e.g., the encapsulation substrate) in which the emission areas EA and the non-emission areas NEA between the emission areas EA are defined is prepared. In an embodiment, the color filter layer CFL and the capping layer CPL may be formed on a surface of the encapsulation layer ENC.

Referring to FIGS. 1 to 13, the bank BNK is formed on a surface of the encapsulation layer ENC on which the color filter layer CFL and the capping layer CPL are optionally formed. For example, the bank BNK may be formed on the capping layer CPL. For example, the bank BNK may be formed at a first height H1 (or a first thickness) on the non-emission area NEA of the encapsulation layer ENC on which the color filter layer CFL and the capping layer CPL are formed. The first height H1 may be set to a sufficient height so that ink supplied to each emission areas EA does not overflow in order to form the light conversion patterns LCP in a subsequent process of forming the light conversion patterns LCP. For example, the first height H1 may be set to be greater than or equal to the maximum height of the light conversion patterns LCP.

In an embodiment, the bank BNK may be patterned to have a sidewall substantially normal (e.g., perpendicular) to the main surface of the encapsulation layer ENC, but the present disclosure is not limited thereto. For example, in another embodiment, the bank BNK may be patterned to have an inverted tapered (or tapered) shape.

Referring to FIGS. 1 to 15, the light conversion patterns LCP are formed on a surface of the encapsulation layer ENC on which the bank BNK is formed. For example, the light conversion patterns LCP may be formed on the capping layer CPL in openings of the bank BNK. For example, each light conversion pattern LCP may be formed at a height equal to or less than the first height H1 on the emission areas EA of the encapsulation layer ENC in which the bank BNK is formed.

Figure 14:
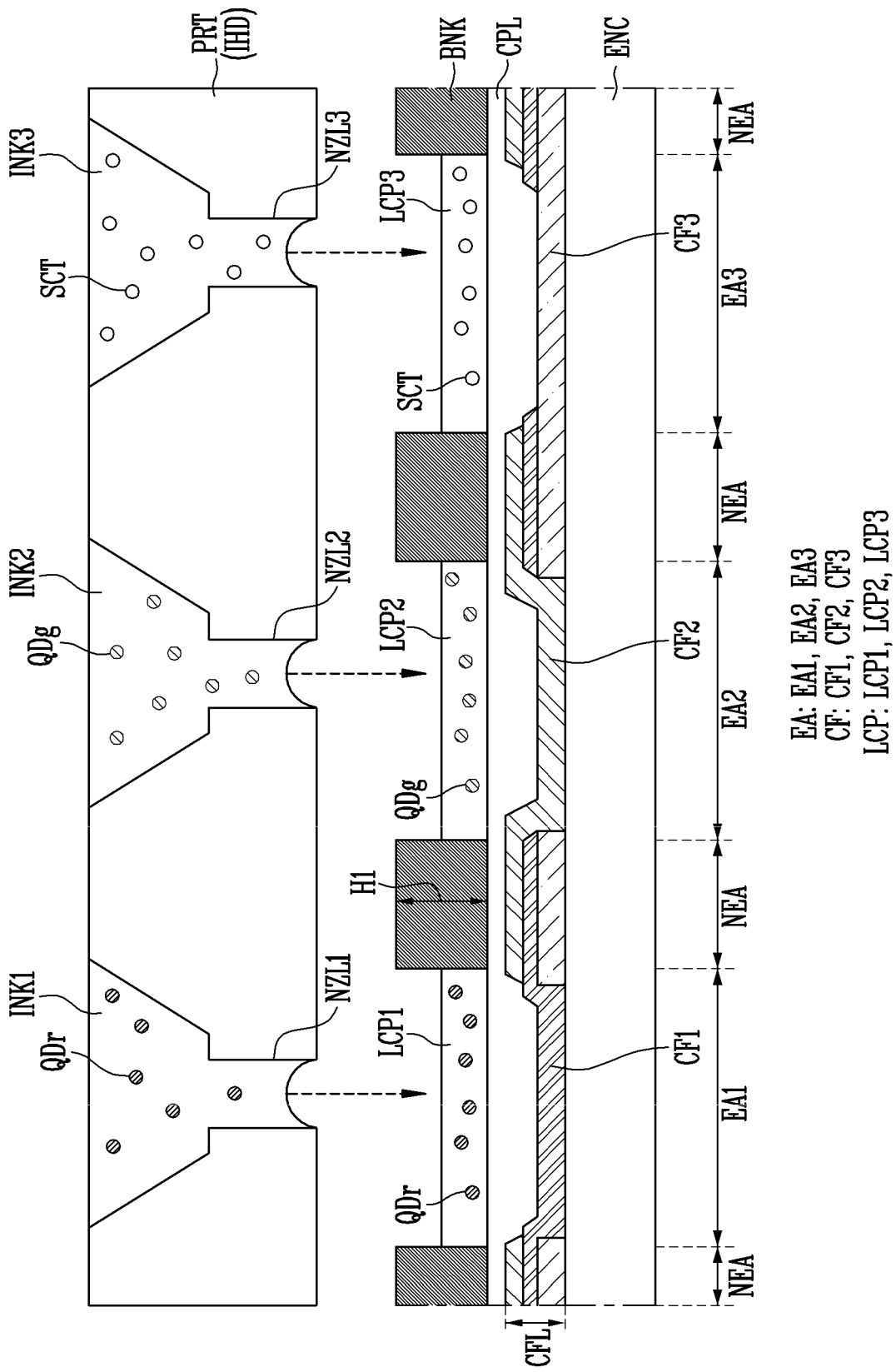
Figure 15:
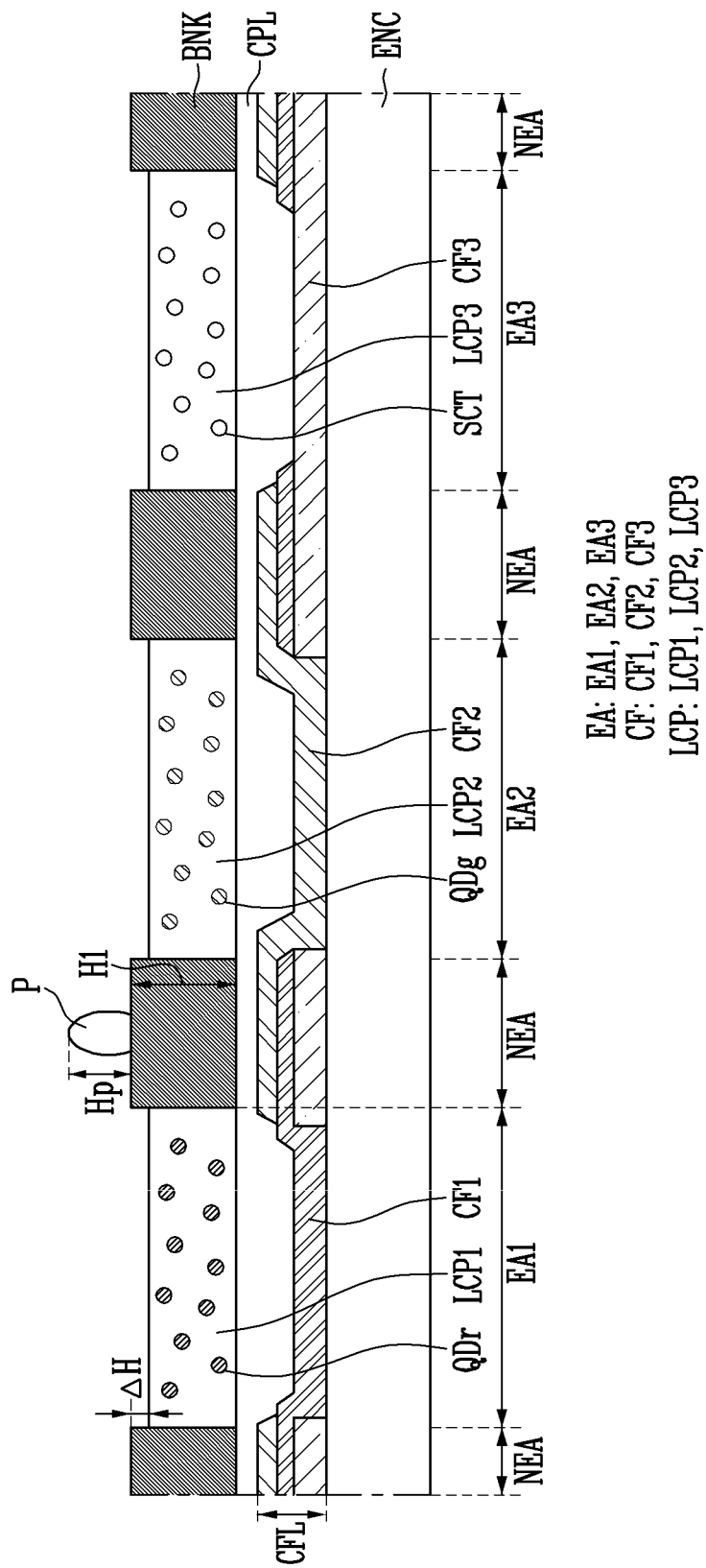
Figure 16:
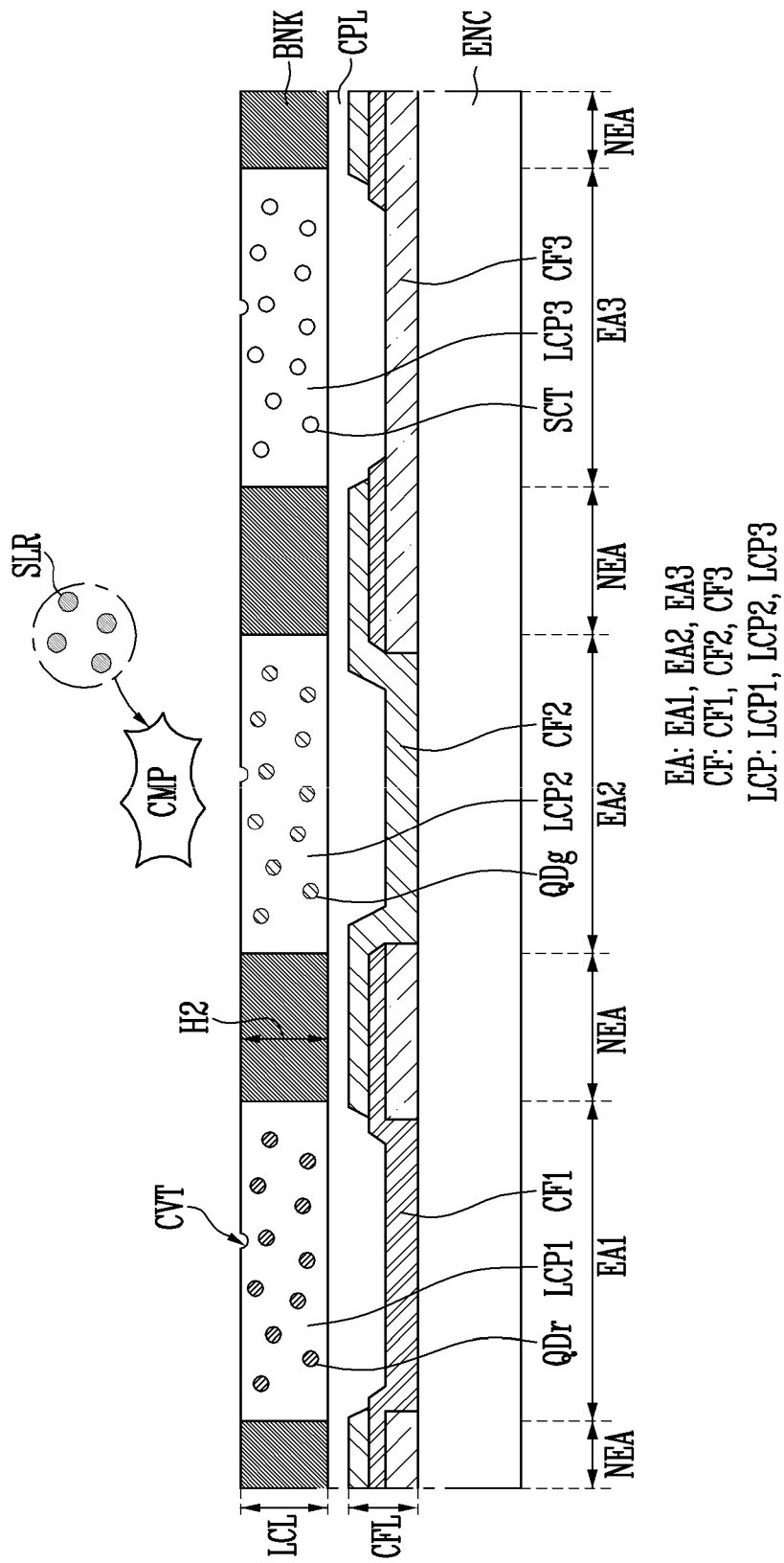
Figure 17:
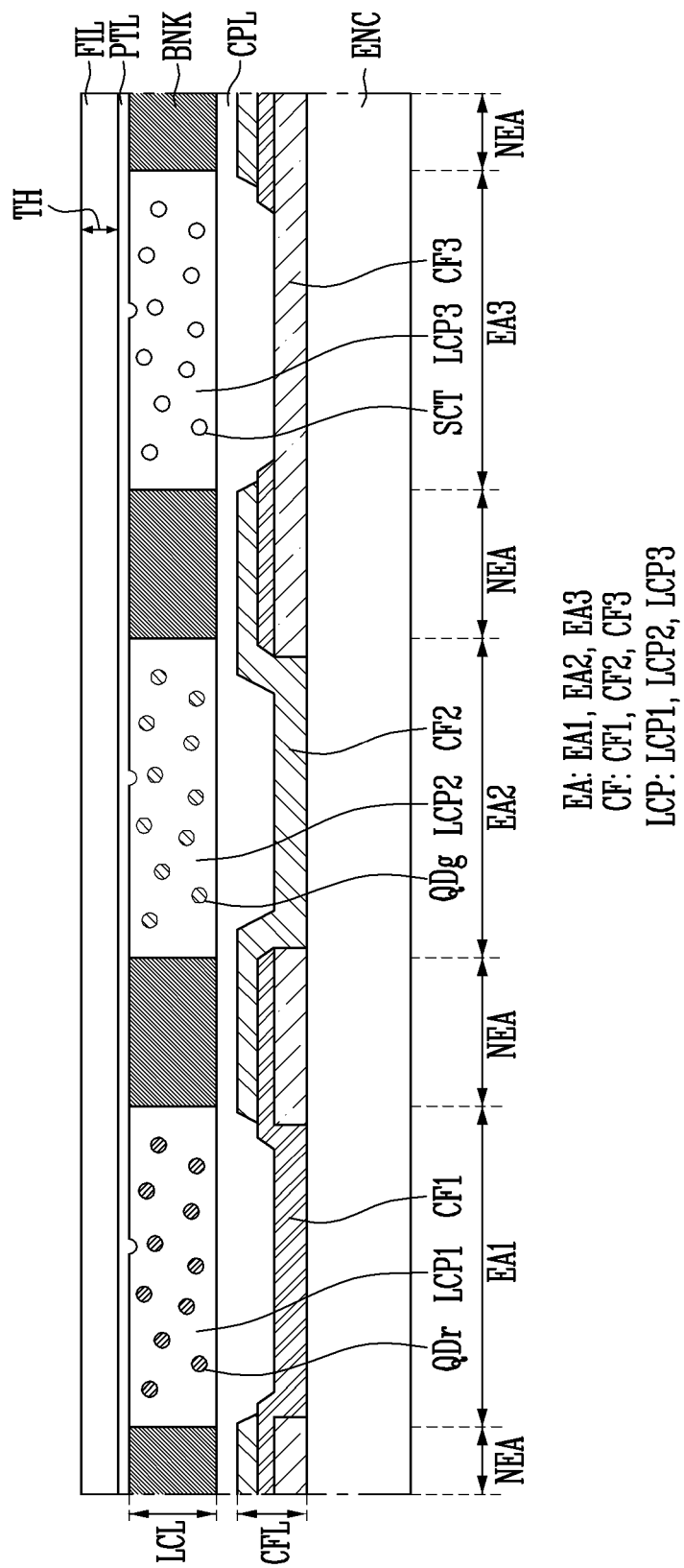

According to an embodiment, as illustrated in FIGS. 14 and 15, the light conversion patterns LCP may be formed through inkjet printing utilizing (e.g., using) an inkjet printer PRT. For example, a head IHD of the inkjet printer PRT may be disposed at (e.g., on or above) a surface of the encapsulation layer ENC on which the bank BNK is formed, and first, second and third inks INK1, INK2, and INK3 respectively including the corresponding color conversion particles and/or light scattering particles SCT may be supplied to each emission area EA through first, second, and third nozzles NZL1, NZL2, and NZL3, respectively, installed in the head IHD. In some embodiments, the inkjet printer PRT is positioned above the bank BNK (e.g., above the bank BNK and in contact with the bank BNK or above the bank BNK and spaced apart from the bank BNK in a thickness direction) when depositing the first, second, and third inks INK1, INK2, and INK3. The first, second, and third inks INK1, INK2, and INK3 may be utilized (e.g., used) to form the first, second, and third light conversion patterns LCP1, LCP2, and LCP3.

For example, the first ink INK1 including color conversion particles of a first color (e.g., red quantum dots QDr) and/or light scattering particles SCT may be supplied through the first nozzle NZL1 in correspondence to the emission area EA1 of the first color pixel PXL1. Similarly, the second ink INK2 including color conversion particles of a second color (e.g., green quantum dots QDg) and/or light scattering particles SCT may be supplied through the second nozzle NZL2 in correspondence to the emission area EA2 of the second color pixel PXL2, and the third ink INK3 including light scattering particles SCT may be supplied through the third nozzle NZL3 in correspondence to the emission area EA3 of the third color pixel PXL3.

In an embodiment, after the inkjet printing process is performed, a subsequent process such as curing may be performed. Accordingly, each light conversion pattern LCP may be formed in each emission area EA.

According to an embodiment, the first, second, and third inks INK1, INK2, and INK3 may be supplied in an appropriate amount so as to fill each emission area EA at (e.g., to) a height equal to or less than the first height H1. Therefore, because the light conversion patterns LCP are formed to be less than or equal to the first height H1, the height difference may occur between the bank BNK and the light conversion patterns LCP. For example, a height difference ΔH (or thickness difference) within a set or certain range (or of a set or certain value) may occur between the bank BNK and at least one light conversion pattern LCP. For example, a height difference of about 1.5 μm may occur between the bank BNK and the light conversion patterns LCP.

Meanwhile, in the process of forming the light conversion patterns LCP, foreign matter P may be generated on the bank BNK. For example, foreign matter P may be generated on the bank BNK due to inkjet misejection and/or the like. The foreign matter P may have a height Hp in a range of about 8 μm to about 10 μm, but the present disclosure is not limited thereto.

Referring to FIGS. 1 to 16, the light conversion layer LCL (e.g., the bank BNK) is polished so that the surface of the light conversion layer LCL including the bank BNK and the light conversion patterns LCP becomes flat (e.g., substantially flat). For example, the planarization process may be performed on the light conversion layer LCL so that the height difference between the bank BNK and the light conversion patterns LCP is removed.

In an embodiment of the present disclosure, the surface of the light conversion layer LCL may be planarized through chemical mechanical polishing CMP utilizing (e.g., using) a slurry SLR having a sufficient degree of hardness to remove the foreign matter P.

For example, quantum dot (QD) stop slurry may be prepared utilizing (e.g., using) a zeta potential between the bank BNK and the light conversion patterns LCP and utilized (e.g., used) for planarization of the light conversion layer LCL, and the surface of the light conversion layer LCL may be planarized so that the bank BNK and the light conversion patterns LCP have a second height H2. The second height H2 may be lower than the first height H1 and may be substantially equal to or less than the formation height of the light conversion patterns LCP. For example, the process of planarizing the bank BNK may include planarizing at least one of the light conversion patterns LCP. For example, the surface of the light conversion layer LCL may be planarized by polishing the light conversion layer LCL according to the height of at least one light conversion pattern LCP having the minimum height among the light conversion patterns LCP. For example, the first, second, and third light conversion patterns LCP1, LCP2, and LCP3 may have different heights when formed and prior to polishing, and the bank BNK and the light conversion patterns LCP may be polished to a height equal to or less than a height of a light conversion pattern of the first, second, and third light conversion patterns LCP1, LCP2, and LCP3 having a smallest height of the first, second, and third light conversion patterns LCP1, LCP2, and LCP3.

In an embodiment of the present disclosure, the material of the slurry SLR may be selected considering the size (e.g., height Hp) of the foreign matter P. For example, the light conversion layer LCL may be polished utilizing (e.g., using) a metallic slurry SLR having a hardness sufficient to stably remove foreign matter P having a height Hp of about 8 μm to about 10 μm. For example, the surface of the light conversion layer LCL may be planarized through chemical mechanical polishing utilizing (e.g., using) an alumina slurry and/or a zirconia slurry having a Mohs hardness of 8 or more. In an embodiment of the present disclosure, the main component of the alumina slurry that may be utilized (e.g., used) for polishing the light conversion layer LCL may be aluminum oxide ($Al_2O_3$), but the present disclosure is not limited thereto. The main component of the zirconia slurry may be zirconium oxide ($ZrO_2$), but the present disclosure is not limited thereto.

In addition, in an embodiment of the present disclosure, by controlling the particle size (e.g., diameter) of the slurry SLR, the surface of the light conversion layer LCL may be planarized and the foreign matter P may be stably removed, so that the height difference between the bank BNK and the light conversion patterns LCP is removed within a range that prevents, minimizes, or reduces damage to the light conversion layer LCL. For example, the surface of the light conversion layer LCL may be planarized utilizing (e.g., using) the slurry SLR having a particle size of about 300 μm to about 1,000 μm (e.g., the alumina slurry or zirconia slurry having a particle size of about 300 μm to about 1,000 μm). When the particle size of the slurry SLR is about 300 μm or more, the effect of stably removing the foreign matter P may be obtained. In addition, when the particle size of the slurry SLR is about 1,000 μm or less, damage to the light conversion patterns LCP and the bank BNK may be prevented, minimized, or reduced.

In an embodiment where at least one light conversion pattern LCP is polished by at least a portion of the thickness, the at least one light conversion pattern LCP may include the microcavities CVT generated in the polishing process. For example, during the chemical mechanical polishing process, at least one color conversion particle and/or light scattering particle SCT may be separated, thus leaving the microcavities CVT on the surface of the at least one light conversion pattern LCP.

Referring to FIGS. 1 to 17, the protective layer PTL may be optionally formed on a surface of the light conversion layer LCL. In addition, the filler layer FIL may be formed on a surface of the encapsulation layer ENC on which the light conversion layer LCL and/or the protective layer PTL are provided. For example, the filler layer FIL may be formed on the protective layer PTL.

In cases where the height difference between the light conversion patterns LCP and the bank BNK is removed through the previously performed planarization process of the light conversion layer LCL, and thus the light conversion layer LCL has a flat (e.g., substantially flat) surface, the thickness TH of the filler layer FIL may be reduced or minimized. For example, the filler layer FIL may be formed to have a thickness TH of about 1.5 μm or more and about 3 μm or less.

In an embodiment of the present disclosure, the upper plate of the display panel DP may be fabricated through the above-described process. In addition, after the lower plate of the display panel DP is fabricated separately from the process of fabricating the upper plate of the display panel DP, a process of coupling (e.g., attaching) the upper plate and the lower plate of the display panel DP may be performed. For example, the pixels PXL may be formed by forming the pixel circuit layer PCL and/or the display element layer DPL on a surface of the base layer BSL, and the base layer BSL and the encapsulation layer ENC may be coupled (e.g., attached) to each other so that a surface of the base layer BSL on which the pixels PXL are formed (e.g., the upper surface of the base layer BSL on which the pixels PXL and the protective layer PRL covering the pixels PXL are formed) is in contact with the filler layer FIL.

In the display device DD and the fabricating method thereof according to various suitable embodiments of the present disclosure as described above, the surface of the light conversion layer LCL may be planarized and the foreign matter P may be stably removed within the range that prevents, minimizes, or reduces damage to the light conversion layer LCL including the light conversion patterns LCP and bank BNK. Therefore, the thickness TH of the filler layer FIL may be reduced, and light emission efficiency of light generated from the pixels PXL may be increased.

In addition, the height or thickness of the bank BNK may be reduced during the process of polishing the light conversion layer LCL for planarization. Accordingly, it is possible to prevent the bank BNK from being peeled off or to reduce peeling of the bank BNK.

Although the technical idea of the present disclosure has been described according to the above-described embodiments, it should be noted that the above embodiments are for the purpose of explanation and do not limit the present disclosure, including the above-described embodiments. In addition, those of ordinary skill in the art will appreciate that various suitable modifications can be made thereto within the scope of the technical idea of the present disclosure.

Therefore, the scope of the present disclosure should not be limited to the contents described in the detailed description of the specification, but should be determined by the appended claims and equivalents thereof. In addition, it should be construed that all suitable changes and/or suitable modifications derived from the meaning and scope of the claims and the equivalent concepts thereof fall within the scope of the present disclosure.

What is claimed is:

1. A display device comprising:
   a base layer comprising a display area;
   a plurality of pixels arranged in the display area and comprising respective emission areas;
   a light conversion layer comprising light conversion patterns on the emission areas of the pixels, and a bank between the light conversion patterns to be around side surfaces of the light conversion patterns; and
   a filler layer between the light conversion layer and a surface of the base layer on which the pixels are on,
   wherein the light conversion layer has a flat surface facing the pixels,
   wherein at least one of the light conversion patterns comprises microcavities disposed only on a surface thereof, wherein the light conversion patterns and the filler layer are in contact with each other,
   wherein the microcavities on the surface of the at least one of the light conversion patterns are in contact with the filler layer, and
   wherein the filler layer overlaps with a center of each of the microcavities and extends continuously along the surface.

2. The display device of claim 1, wherein surfaces of the light conversion patterns facing the pixels are the same as a surface of the bank facing the pixels in height with respect to the base layer.

3. The display device of claim 1, wherein the light conversion patterns are the same as the bank in thickness.

4. The display device of claim 1, wherein each of the light conversion patterns comprises at least one selected from color conversion particles and light scattering particles.

5. The display device of claim 4, wherein the microcavities are less than or equal to the color conversion particles or the light scattering particles in size.

6. The display device of claim 1, wherein the pixels comprise a first color pixel, a second color pixel, and a third color pixel, and the light conversion patterns comprise:
   a first light conversion pattern on an emission area of the first color pixel and comprising first color conversion particles;
   a second light conversion pattern on an emission area of the second color pixel and comprising second color conversion particles; and
   a third light conversion pattern on an emission area of the third color pixel and comprising light scattering particles.

7. The display device of claim 1, wherein the filler layer has a thickness of about 1.5 βm to about 3 βm.

8. The display device of claim 1, wherein the bank has a tapered shape or an inverted tapered shape.

9. The display device of claim 1, further comprising:
   a color filter layer on the light conversion layer; and
   an encapsulation substrate on the color filter layer.

10. The display device of claim 1, further comprising:
    a color filter layer on the light conversion layer.

11. The display device of claim 1, further comprising:
    an encapsulation substrate on the light conversion layer.

* * * * *